US012796274B2

(12) United States Patent
Lee et al.

(10) Patent No.: US 12,796,274 B2
(45) Date of Patent: Nov. 10, 2026

(54) DISPLAY APPARATUS COMPRISING A COLOR FILTER LAYER DISPOSED ON A TOUCH INSULATING LAYER

(71) Applicant: Samsung Display Co., Ltd., Yongin-Si (KR)

(72) Inventors: Eunggyu Lee, Yongin-si (KR); Soohye Ryu, Yongin-si (KR); Haechan Park, Yongin-si (KR); Hongjo Park, Yongin-si (KR); Baekmin Oh, Yongin-si (KR); Haeju Yun, Yongin-si (KR); Hyemin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 353 days.

(21) Appl. No.: 18/434,822

(22) Filed: Feb. 7, 2024

(65) Prior Publication Data

US 2025/0056998 A1 Feb. 13, 2025

(30) Foreign Application Priority Data

Aug. 11, 2023 (KR) ........................ 10-2023-0105630

(51) Int. Cl.
*H10K 59/38* (2023.01)
*H10K 59/131* (2023.01)
(Continued)

(52) U.S. Cl.
CPC ........... *H10K 59/38* (2023.02); *H10K 59/131* (2023.02); *H10K 59/40* (2023.02); *H10K 59/70* (2023.02);
(Continued)

(58) Field of Classification Search
CPC ........ H10K 59/35; H10K 59/38; H10K 59/40; H10K 59/873; H10K 59/878; H10K 59/70; H10K 59/131; H10K 59/8792
See application file for complete search history.

(56) References Cited

U.S. PATENT DOCUMENTS

| | | | |
|---|---|---|---|
| 10,409,411 | B2 | 9/2019 | Heo et al. |
| 11,508,784 | B2 | 11/2022 | Li |

(Continued)

FOREIGN PATENT DOCUMENTS

| | | | |
|---|---|---|---|
| KR | 10-2018-0074980 | A | 7/2018 |
| KR | 10-2022-0058720 | A | 5/2022 |

(Continued)

*Primary Examiner* — Khiem D Nguyen
(74) *Attorney, Agent, or Firm* — Innovation Counsel LLP

(57) ABSTRACT

A display apparatus includes first, second, and third light-emitting devices on a substrate, an encapsulation layer covering the first through third light-emitting devices, a touch electrode disposed on the encapsulation layer and having a first opening, a second opening, and a third opening, the first opening, the second opening, and the third opening overlapping the first light-emitting device, the second light-emitting device, and the third light-emitting device, respectively, a touch insulating layer on the encapsulation layer, a color filter layer or reflection adjustment layer disposed on the touch insulating layer and also disposed in the second opening of the touch electrode overlapping the second light-emitting device, and a planarization layer. The planarization layer may directly contact an upper surface of the touch insulating layer through the first and third openings.

20 Claims, 14 Drawing Sheets

(51) Int. Cl.

| | |
|---|---|
| ***H10K 59/40*** | (2023.01) |
| ***H10K 59/70*** | (2023.01) |
| ***H10K 59/80*** | (2023.01) |

(52) U.S. Cl.
CPC ......... *H10K 59/873* (2023.02); *H10K 59/878* (2023.02)

(56) References Cited

U.S. PATENT DOCUMENTS

| | | | | |
|---|---|---|---|---|
| 2019/0013363 | A1* | 1/2019 | Joo | H10K 59/35 |
| 2022/0140283 | A1 | 5/2022 | Kim et al. | |
| 2022/0293890 | A1* | 9/2022 | Jeong | H10K 59/8792 |
| 2023/0013127 | A1 | 1/2023 | Lee et al. | |
| 2023/0094620 | A1* | 3/2023 | Lee | H10K 59/878 257/40 |

FOREIGN PATENT DOCUMENTS

| | | | |
|---|---|---|---|
| KR | 10-2023-0003713 | A | 1/2023 |
| KR | 10-2023-0036572 | A | 3/2023 |

* cited by examiner

DISPLAY APPARATUS COMPRISING A COLOR FILTER LAYER DISPOSED ON A TOUCH INSULATING LAYER

CROSS-REFERENCE TO RELATED APPLICATION

This application is based on and claims priority under 35 U.S.C. § 119 to Korean Patent Application No. 10-2023-0105630, filed on Aug. 11, 2023, in the Korean Intellectual Property Office, the disclosure of which is incorporated by reference herein in its entirety.

BACKGROUND

1. Field

One or more embodiments relate to an apparatus, in particular, a display apparatus.

2. Description of the Related Art

Display apparatuses display data visually. Such a display apparatus may include a substrate divided into a display area and a non-display area. A plurality of pixels may be included in the display area. In addition, a thin-film transistor corresponding to each of the plurality of pixels and a sub-pixel electrode electrically connected to the thin-film transistor may be provided in the display area. In addition, a light-emitting layer may be disposed in the display area to correspond to a sub-pixel electrode. Also, an opposite electrode may be disposed in the display area and commonly provided in each of the pixels. Various wirings, a driving unit, a control unit, and the like may be provided in the non-display area to transmit electrical signals to the display area.

SUMMARY

A sub-pixel electrode or an opposite electrode in a pixel of a display apparatus may be reflective and positioned so that constructive interference of light emitted from a light-emitting layer increases the luminance of front light. The constructive interference may cause a luminance difference between the front light that proceeds perpendicular to the surface of the display apparatus (or an upper surface of a light-emitting device) and side light that proceeds at an oblique angle (for example, 45 degrees). In addition, a difference between the wavelength ranges or luminance distributions of the front light and the side light may occur so that colors of front light and side light may be seen differently depending on an observer's position. For example, the peak wavelength of the side light may be shorter than the peak wavelength of the front light so that an observer in a position to see the front light may recognize one color, e.g., light green, and an observer in a position to see the side light may recognize a different color, e.g., blue green. A color filter layer or a reflection adjustment layer as disclosed herein may reduce the differences between front light and side light emitted from pixels of a display apparatus.

Additional aspects will be set forth in part in the description which follows and, in part, will be apparent from the description, or may be learned by practice of the presented embodiments of the disclosure.

According to one aspect of the disclosure, a display apparatus includes a first light-emitting device, a second light-emitting device, and a third light-emitting device, the first light-emitting device, the second light-emitting device, and the third light-emitting device being arranged on a substrate, an encapsulation layer covering the first light-emitting device, the second light-emitting device, and the third light-emitting device, a touch electrode disposed on the encapsulation layer and having a first opening, a second opening, and a third opening overlapping the first light-emitting device, the second light-emitting device, and the third light-emitting device, respectively, a touch insulating layer between the encapsulation layer and the touch electrode, a color filter layer disposed on the touch insulating layer and also disposed in the second opening of the touch electrode overlapping the second light-emitting device, and a planarization layer disposed on the color filter layer, wherein the planarization layer is in direct contact with an upper surface of the touch insulating layer through the first opening and the third opening of the touch electrode.

The touch electrode may include a first conductive line and a second conductive line with the second opening being between the first conductive line and the second conductive line.

The color filter layer may be between the first conductive line and the second conductive line of the touch electrode.

The width of the color filter layer may be less than the width of the second opening.

The color filter layer may cover an upper surface of the first conductive line and an upper surface of the second conductive line of the touch electrode.

One side surface of the color filter layer and one side surface of the first conductive line of the touch electrode may be on the same plane.

The color filter layer may include a material having a maximum transmittance in a wavelength range of about 520 nm to about 530 nm.

The maximum transmittance of the material of the color filter layer may be 90% or more.

The material of the color filter layer may have a Full Width at Half Maximum (FWHM) of 100 nm or less.

A luminance of the display apparatus measured in a direction oblique to an upper surface of the substrate at 45 degrees may be 60% or more of a luminance of the display apparatus measured in a direction perpendicular to the upper surface of the substrate at 90 degrees.

The planarization layer may include a plurality of layers including different materials.

According to another aspect of the disclosure, a display apparatus includes first through third light-emitting devices arranged on a substrate, an encapsulation layer covering the first through third light-emitting devices, a touch electrode disposed on the encapsulation layer and having a first opening, a second opening, and a third opening overlapping the first light-emitting device, the second light-emitting device, and the third light-emitting device, respectively, a touch insulating layer on the encapsulation layer, and a reflection adjustment layer disposed on the touch electrode and including a material that absorbs light in a wavelength range of 580 nm to 600 nm, and a planarization layer covering the reflection adjustment layer.

The reflection adjustment layer may be disposed in the second opening of the touch electrode.

The planarization layer may be in direct contact with the touch insulating layer through the first opening and the third opening of the touch electrode.

The touch electrode may include conductive lines surrounding the second opening, and the reflection adjustment layer may overlap an upper surface of the conductive lines of the touch electrode.

The width of the reflection adjustment layer may be less than the width of the second opening of the touch electrode.

The reflection adjustment layer may extend to overlap the first opening, the second opening, and the third opening of the touch electrode.

The reflection adjustment layer may include a material having a transmittance of 0.5 or less in a wavelength range of about 585 nm to about 595 nm.

A luminance of the display apparatus measured in a direction oblique to an upper surface of the substrate at 45 degrees may be 60% or more of a luminance of the display apparatus measured in a direction perpendicular to the upper surface of the substrate at 90 degrees.

The planarization layer may include a plurality of layers including different materials.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
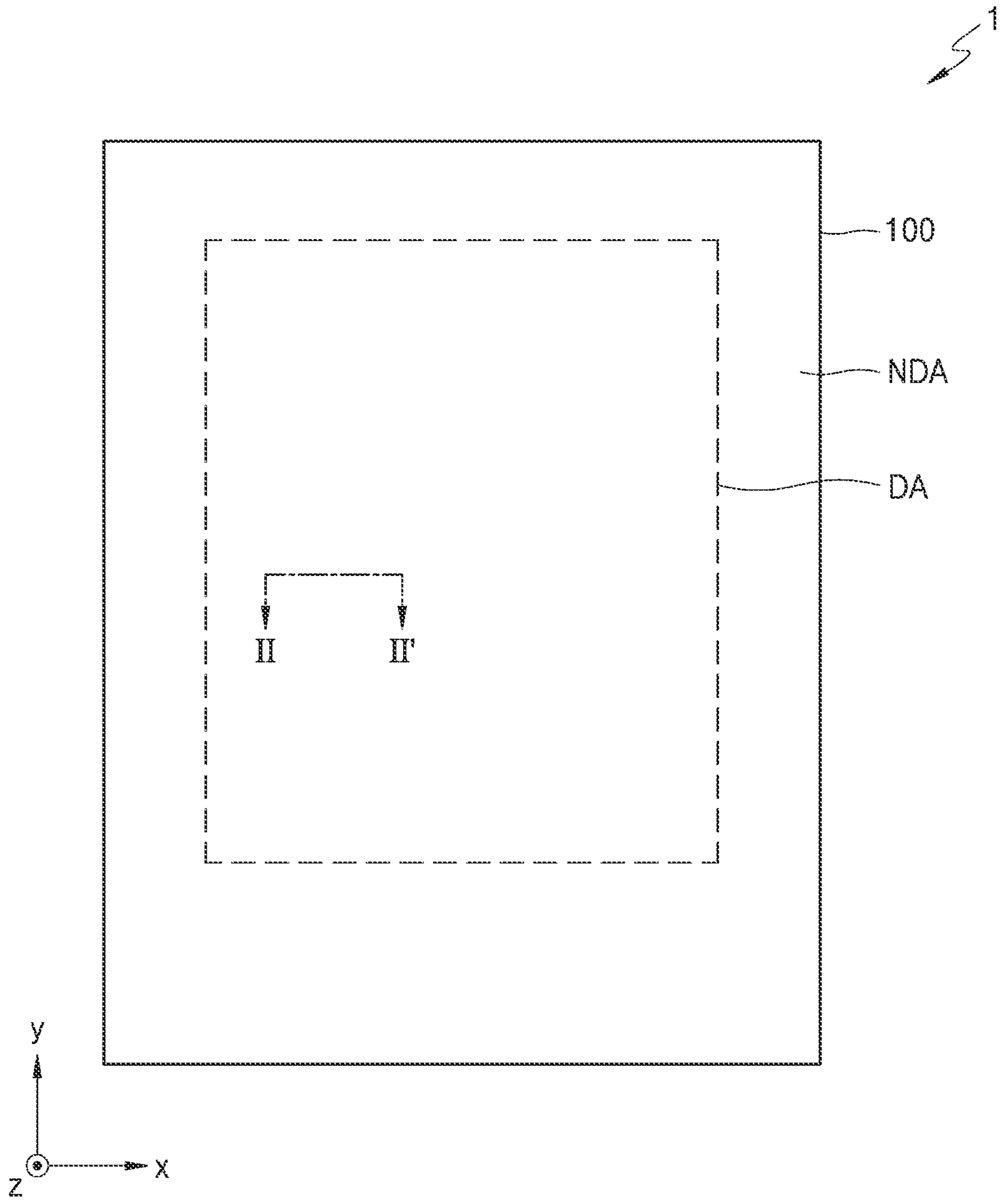
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Since various modifications and various embodiments of the present disclosure are possible, only some specific embodiments are illustrated in the drawings and described in detail in the detailed description. Effects and features of the present disclosure and methods of achieving them will be apparent with reference to the embodiments described below in detail in conjunction with the drawings. However, the present disclosure is not limited to the embodiments disclosed herein but may be implemented in a variety of forms.

In the following, the terms "first," "second," etc. are used for the purpose of distinguishing one element from other elements, not in a limiting sense.

In the following, a singular or plural expression includes the cases of a single item or multiple items unless the context is clearly different.

In the following, terms such as "comprising" or "having" are meant to identify features or the elements that are present, and the possible presence of one or more other features or elements is not excluded, unless exclusion is expressly indicated.

In the following, a portion such as a layer, a region, an element, or the like being on another portions includes not only a case in which the portion is directly on the other portions but also cases in which other elements are interposed therebetween.

In the drawings, the sizes of elements may be exaggerated or reduced. For example, the size and thickness of each component in the drawings may be shown for convenience of explanation or illustration, and the present disclosure is not necessarily limited to the illustration.

In the present specification, in the case where an order for some embodiments of a specific process may be described, the specific process order may be performed differently from the order described. For example, two processes described in succession may be substantially performed at the same time or in an opposite order to the order described.

In the present specification, "A and/or B" is A, B, or A and B. In addition, "at least one of A and B" is A, B, or A and B. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

In the following, when elements such as layers, regions, components, etc. are connected to each other, the elements may be directly connected to each other, or the elements may be indirectly connected to each other with other layers, regions or components interposed between the elements. For example, when the present specification describes layers, regions, components, etc. are electrically connected to each other, the layers, regions, components, etc. may be directly electrically connected to each other, and/or the layers, regions, components, etc. may be indirectly electrically connected to each other with other layers, regions, or components interposed between the layer, region, or components.

The following may describe directions or relative positions with reference to an x-axis, a y-axis, and a z-axis. The x-axis, the y-axis, and the z-axis are not limited to three axes on a Cartesian coordinate system and may be interpreted in a broad sense including the same. For example, the x-axis, the y-axis, and the z-axis may be perpendicular to each other but may be different directions that are not perpendicular to each other.

FIG. 1 is a plan view schematically illustrating a display apparatus 1 according to an embodiment.

Referring to FIG. 1, the display apparatus 1 may include a display area DA and a non-display area NDA. Sub-pixels each including a display element such as a light-emitting diode may be arranged in the display area DA and may operate to produce an image in the display area DA. The non-display area NDA may be an area in which no image is provided and may surround the display area DA. A scan driver and a data driver, which provide electrical signals to the sub-pixels of the display area DA, and power supply lines, through which power such as a driving voltage and a common voltage is provided, may be arranged in the non-display area NDA.

FIG. 1 illustrates that the display apparatus 1 has a length in an x axis direction that is less than its length in a y axis direction crossing the x axis direction. However, embodiments are not limited thereto. In another embodiment, the length in the x axis direction may be greater than the length in the y axis direction, and the shape of the display apparatus 1 may be variously changed.

The display apparatus 1 may be applied to various products, such as mobile phones, smart phones, personal computers (PCs), mobile communication terminals, electronic notes, electronic books, portable multimedia players (PMPs), navigation devices, ultra mobile PCs, televisions (TVs), laptop computers, monitors, billboards, Internet of Things (IoT), and the like. In addition, the display apparatus 1 according to an embodiment may be used for a wearable device such as a smart watch, a watch phone, a glasses type display, or a head mounted display (HMD). In addition, the display apparatus 1 according to an embodiment may be used as an instrument panel of a vehicle, and a center information display (CID) display disposed on a center fascia or a dashboard of a vehicle, a room mirror display for replacing a side mirror of a vehicle, and a display screen that is entertainment for the rear seat of the vehicle and is disposed on the rear surface of the front seat.

Figure 2:
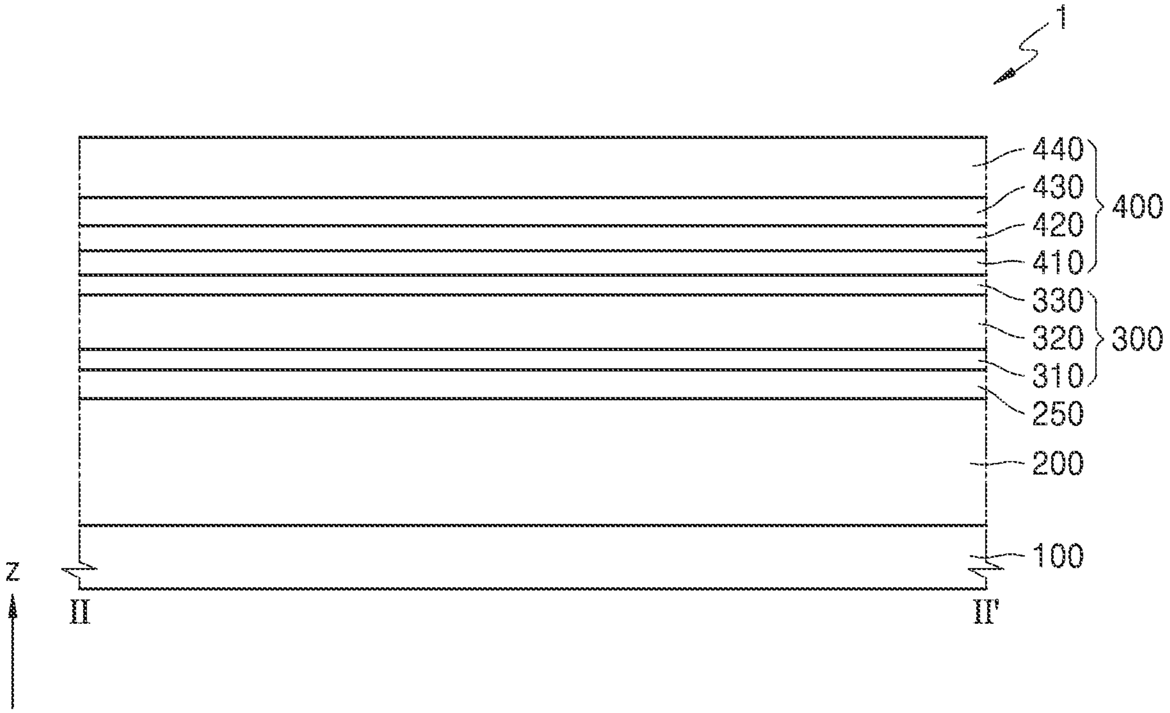
FIG. 2 is a cross-sectional view of the display apparatus taken along a line II-II' of FIG. 1.

FIG. 2 is a cross-sectional view of the display apparatus 1 taken along a line II-II' of FIG. 1.

Referring to FIG. 2, the display apparatus 1 may include a substrate 100, a display element layer 200, a low reflection layer 250, an encapsulation layer 300, and an input sensing layer 400.

The substrate 100 may include glass or polymer resin. For example, the polymer resin may include polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may have flexible, rollable, or bendable characteristics. The substrate 100 may have a multi-layered structure including a layer including the above-described polymer resin and an inorganic layer (not shown).

The display element layer 200 may include a light-emitting diode as a display element, a thin-film transistor electrically connected to the light-emitting diode, and insulating layers between the light-emitting diode and the thin-film transistor.

The low reflection layer 250 may be disposed on the display element layer 200, and the encapsulation layer 300 may be disposed on the low reflection layer 250. For example, the display element layer 200 and/or the low reflection layer 250 may be sealed with the encapsulation layer 300. The encapsulation layer 300 may include at least one inorganic encapsulation layer and at least one organic encapsulation layer. For example, the encapsulation layer 300 may include a first inorganic encapsulation layer 310, a second inorganic encapsulation layer 330, and an organic encapsulation layer 320. The organic encapsulation layer 320 may be between the first and second inorganic encapsulation layers 310 and 330.

In some embodiments, the display apparatus 1 may include an encapsulation substrate (not shown) formed of a glass material instead of the encapsulation layer 300. The encapsulation substrate may be disposed on the display element layer 200, and the display element layer 200 may be between the substrate 100 and the encapsulation substrate. A gap may exist between the encapsulation substrate and the display element layer 200, and the gap may be filled with a filling material.

The input sensing layer 400 may be disposed on the encapsulation layer 300. The input sensing layer 400 may detect external input, for example, the touch of an object such as a finger or a pen so that the display apparatus 1 may obtain coordinate information corresponding to a position of touch. The input sensing layer 400 may include a touch electrode and signal lines connected to the touch electrode. The input sensing layer 400 may detect an external input by using a mutual capacitance method or a self-capacitance method.

In an embodiment, the input sensing layer 400 may include first and second touch electrode layers 410 and 430, a touch insulating layer 420, and a planarization layer 440. The first touch electrode layer 410 may be arranged on the encapsulation layer 300. The touch insulating layer 420, the second touch electrode layer 430, and the planarization layer 440 may be sequentially disposed on the first touch electrode layer 410. In other words, the touch insulating layer 420 may be between the first and second touch electrode layers 410 and 430, and the planarization layer 440 may be disposed on the second touch electrode layer 430.

The touch insulating layer 420 may include an inorganic insulating material. The planarization layer 440 may include an organic insulating material. The first and second touch electrode layers 410 and 430 may be disposed in specific patterns and may include metal layers.

In another embodiment, an insulating layer may be additionally between the input sensing layer 400 and the encapsulation layer 300. For example, another insulating layer may be additionally between the first touch electrode layer 410 and the second inorganic encapsulation layer 330.

Figure 3:
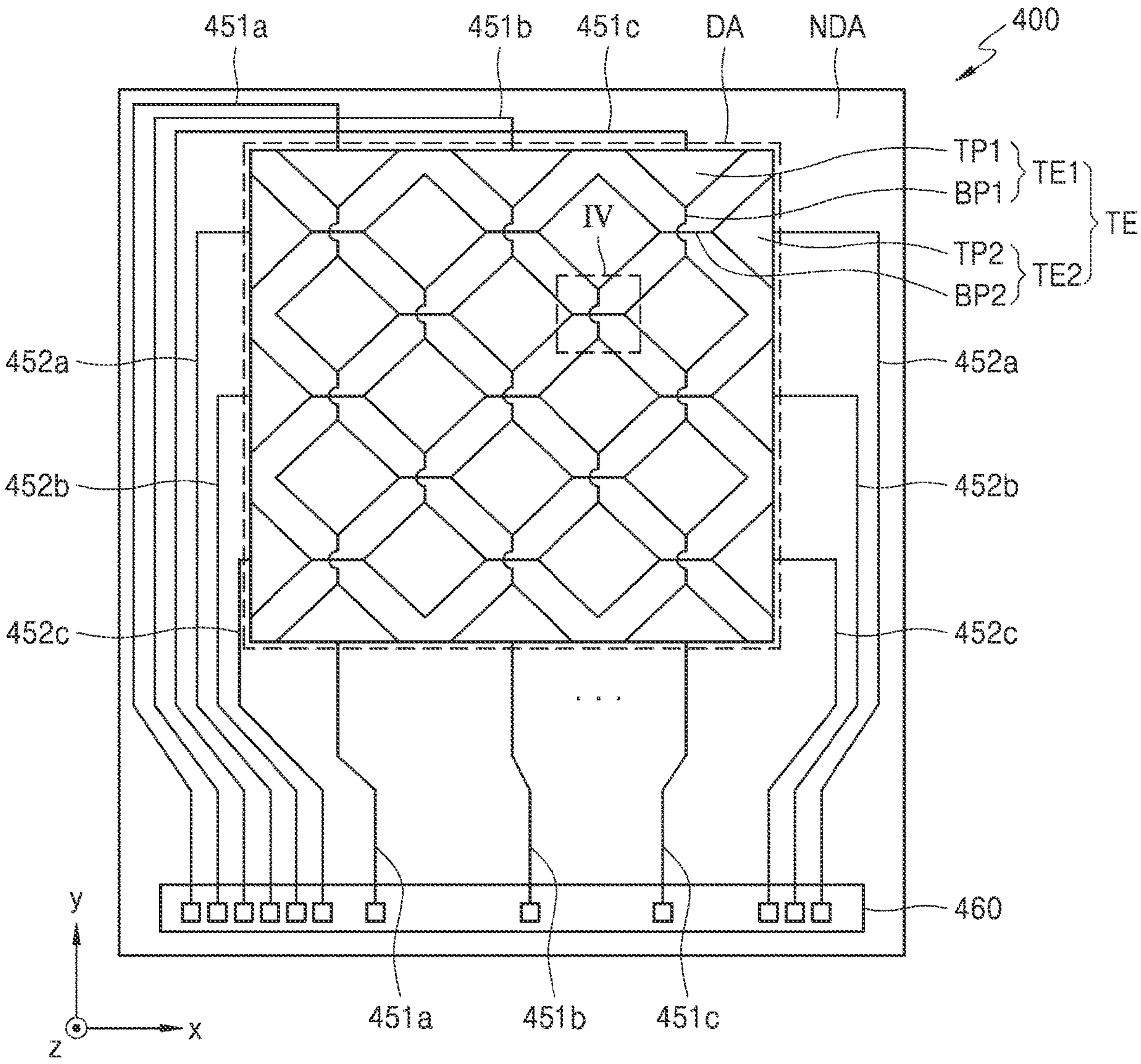
FIG. 3 is a plan view illustrating a portion of a display apparatus according to an embodiment.

FIG. 3 is an extracted plan view illustrating a portion of the display apparatus 1 according to an embodiment.

Referring to FIG. 3, the input sensing layer 400 may include first touch electrodes TE1 including first touch patterns TP1 and first bridge patterns BP1, and first signal lines 451*a*, 451*b*, and 451*c* connected to the first touch patterns TP1. The input sensing layer 400 may include second touch electrodes TE2 including second touch patterns TP2 and second bridge patterns BP2, and second signal lines 452*a*, 452*b*, and 452*c* connected to the second touch patterns TP2. For example, each first touch electrode TE1 may include a set of the first touch patterns TP1 arranged along the ty direction and connected to each other through the first bridge pattern BP1 between the adjacent first touch patterns TP1. Each second touch electrodes TE2 may include a set of the second touch patterns TP2 arranged along the x direction and connected to each other through the second bridge pattern BP2 between the adjacent second touch patterns TP2. The first touch electrodes TE1 and the second touch electrodes TE2 may cross one another. In an embodiment, the first bridge pattern BP1 and the second bridge pattern BP2 may cross each other without being electrically connected.

The first touch electrodes TE1 and the second touch electrodes TE2 may be arranged in the display area DA. The first signal lines 451*a*, 451*b*, and 451*c* and the second signal lines 452*a*, 452*b*, and 452*c*, which are connected to the first touch patterns TP1 and the second touch patterns TP2, respectively, may be arranged in the non-display area NDA. The first touch electrodes TE1 may be connected to a sensing terminal portion 460 through the first signal lines 451*a*, 451*b*, and 451*c*. The second touch electrodes TE1 may be connected to the sensing terminal portion 460 through the second signal lines 452*a*, 452*b*, and 452*c*.

FIG. 3 illustrates that the first signal lines 451*a*, 451*b* and 451*c* are connected to upper and lower sides of each of the first touch electrodes TE1. However, embodiments are not limited thereto. In another embodiment, each of the first signal lines 451*a*, 451*b*, and 451*c* may be connected only to the upper side or the lower side of the first touch electrodes TE1.

FIG. 3 illustrates that the second signal lines 452*a*, 452*b* and 452*c* are connected to left and right sides of the second touch electrodes TE2. However, embodiments are not limited thereto. In another embodiment, each of the second signal lines 452*a*, 452*b*, and 452*c* may be connected only the left side or the right side of each of the second touch electrodes TE2.

FIG. 3 illustrates that upper first signal lines 451*a*, 451*b*, and 451*c* and lower first signal lines 451*a*, 451*b*, and 451*c* are respectively connected to the sensing terminal portion 460. However, embodiments are not limited thereto. In another embodiment, the upper first signal lines 451*a*, 451*b*, and 451*c* and the lower first signal lines 451*a*, 451*b*, and 451*c* may be connected to the sensing terminal portion 460 and electrically connected to each other in the non-display area NDA.

FIG. 3 illustrates that left second signal lines 452*a*, 452*b*, and 452*c* and right second signal lines 452*a*, 452*b*, and 452*c* are respectively connected to the sensing terminal portion 460. However, embodiments are not limited thereto. In another embodiment, the left second signal lines 452*a*, 452*b*, and 452*c* and the right second signal lines 452*a*, 452*b*, and 452*c* may be connected to the sensing terminal portion 460 and electrically connected to each other in the non-display area NDA.

FIG. 3 illustrates that the input sensing layer 400 includes a plurality of touch patterns suitable for a mutual capacitive method, and the touch patterns include a first touch electrode TE1 including a set of first touch patterns TP1 arranged in the same column and a second touch electrode TE2 including a set of second touch patterns TP2 arranged in the same row. However, embodiments are not limited thereto. In another embodiment, touch patterns of the input sensing layer 400 may employ a self-capacitive method, whereby the touch patterns of the input sensing layer 400 are respectively connected to corresponding signal lines allowing coordinates of a touch event to be detected. Hereinafter, for convenience of explanation, the case where the input sensing layer 400 employs a mutual capacitive method is described.

Figure 4:
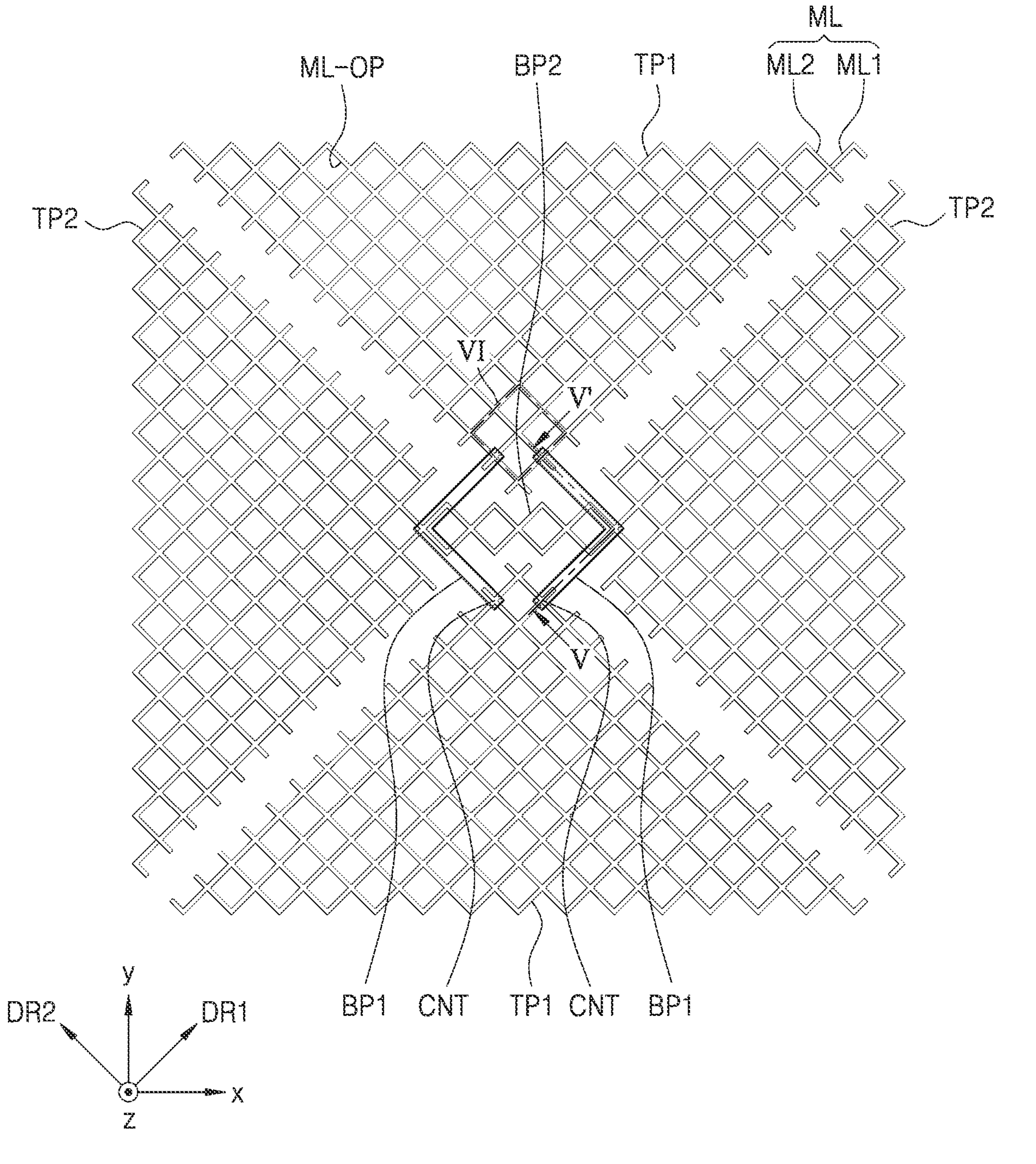
FIG. 4 is an enlarged plan view illustrating a region IV of the display apparatus shown in FIG. 3.

FIG. 4 is an enlarged plan view illustrating a region IV of the display apparatus 1 shown in FIG. 3.

Referring to FIG. 4, the first touch pattern TP1 and another adjacent first touch pattern TP1 may be electrically connected to each other via the first bridge pattern BP1. The second touch pattern TP2 and another adjacent second touch pattern TP2 may be electrically connected to each other via the second bridge pattern BP2.

Each of the first touch pattern TP1, the second touch pattern TP2, the first bridge pattern BP1, and the second bridge pattern BP2 may be a mesh pattern including first and second mesh lines ML1 and ML2. The first mesh lines ML1 may extend in a first direction DR1, and the second mesh lines ML2 may extend in a second direction DR2.

Two adjacent first mesh lines ML1 and two adjacent second mesh lines ML2 may cross at a mesh opening ML-OP. In other words, each mesh opening ML-OP may be defined or bounded by a pair of adjacent first mesh lines ML1 and a pair of adjacent second mesh lines ML2 that cross each other. A light-emitting diode to be described later may overlap or be disposed under one of the mesh openings ML-OP.

The first bridge pattern BP1 may include an approximately L-shape line including a portion extending in the first direction DR1 and a portion extending in the second direction DR2. The first bridge pattern BP1 may be separate or in a separate layer from the first touch pattern TP1, and portions of the first bridge pattern BP1 and the first touch pattern TP1 may overlap each other in a plan view and may be in contact with each other and electrically connected to each other, e.g., through vias or openings in an intervening insulating layer.

The second bridge pattern BP2 may include sections of the first mesh line ML1 and the second mesh line ML2 may be repeatedly connective and may collectively extend in the x direction. The second bridge pattern BP2 may be formed integrally or in the same layer with the second touch pattern TP2. Thus, a portion of the second touch electrode that is disposed in an approximately rectangular region between the two L-shaped first bridge patterns BP1, as shown in FIG. 4, may be understood as the second bridge pattern BP2, and a portion of the second touch electrode that is disposed in other regions than the rectangular region may be understood as the second touch pattern TP2.

Figure 5:
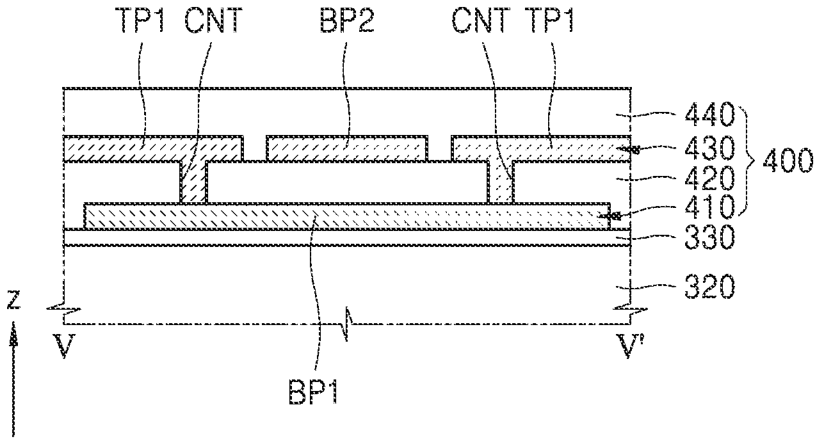
FIG. 5 is a cross-sectional view of the display apparatus taken along a line V-V' of FIG. 4.

FIG. 5 is a cross-sectional view of the display apparatus 1 taken along a line V-V' of FIG. 4.

Referring to FIG. 5, the input sensing layer 400 may include a first touch electrode layer 410, a touch insulating layer 420 disposed on the first touch electrode layer 410, a second touch electrode layer 430 disposed on the touch insulating layer 420, and a planarization layer 440 disposed on the second touch electrode layer 430.

The first touch electrode layer 410 may be arranged on the second inorganic encapsulation layer 330. The organic encapsulation layer 320 may be disposed under the second inorganic encapsulation layer 330.

A some of the first touch pattern TP1, a second touch pattern (not shown), the first bridge pattern BP1, and the second bridge pattern BP2 may be located on or formed in the first touch electrode layer 410, and the others of the first touch pattern TP1, the second touch pattern (not shown), the first bridge pattern BP1, and the second bridge pattern BP2 may be located on or formed in the second touch electrode layer 430. For example, the first touch electrode layer 410 may include the first bridge pattern BP1, and the second touch electrode layer 430 may include the first touch pattern TP1, the second touch pattern (not shown), and the second bridge pattern BP2.

The adjacent second touch patterns (not shown) may be electrically connected to each other via second bridge patterns BP2 located on the same layer.

The adjacent first touch patterns TP1 may be electrically connected to each other via first bridge patterns BP1 located on different layers. For example, the adjacent first touch patterns TP1 may be disposed on the second touch electrode layer 430, and the first bridge pattern BP1 that electrically connects the first touch patterns TP1 may be disposed on the first touch electrode layer 410. The first touch pattern TP1 may be connected to the first bridge pattern BP1 through contact holes CNTs formed in the touch insulating layer 420.

The planarization layer 440 may cover the second touch electrode layer 430 (or the first touch pattern TP1, the second touch pattern (not shown), and the second bridge pattern BP2).

FIG. 5 illustrates an example in which the first bridge pattern BP1 is located on the first touch electrode layer 410 and the first touch pattern TP1 and the second bridge pattern BP2 are located on the second touch electrode layer 430. However, embodiments are not limited thereto. In another embodiment, the first touch pattern TP1 and the first bridge pattern BP1 may be located on the first touch electrode layer 410 and the second touch pattern (not shown) and the second bridge pattern BP2 may be located on the second touch electrode 430 without the need to form contact holes CNTs in the second touch insulating layer 412.

Figure 6:
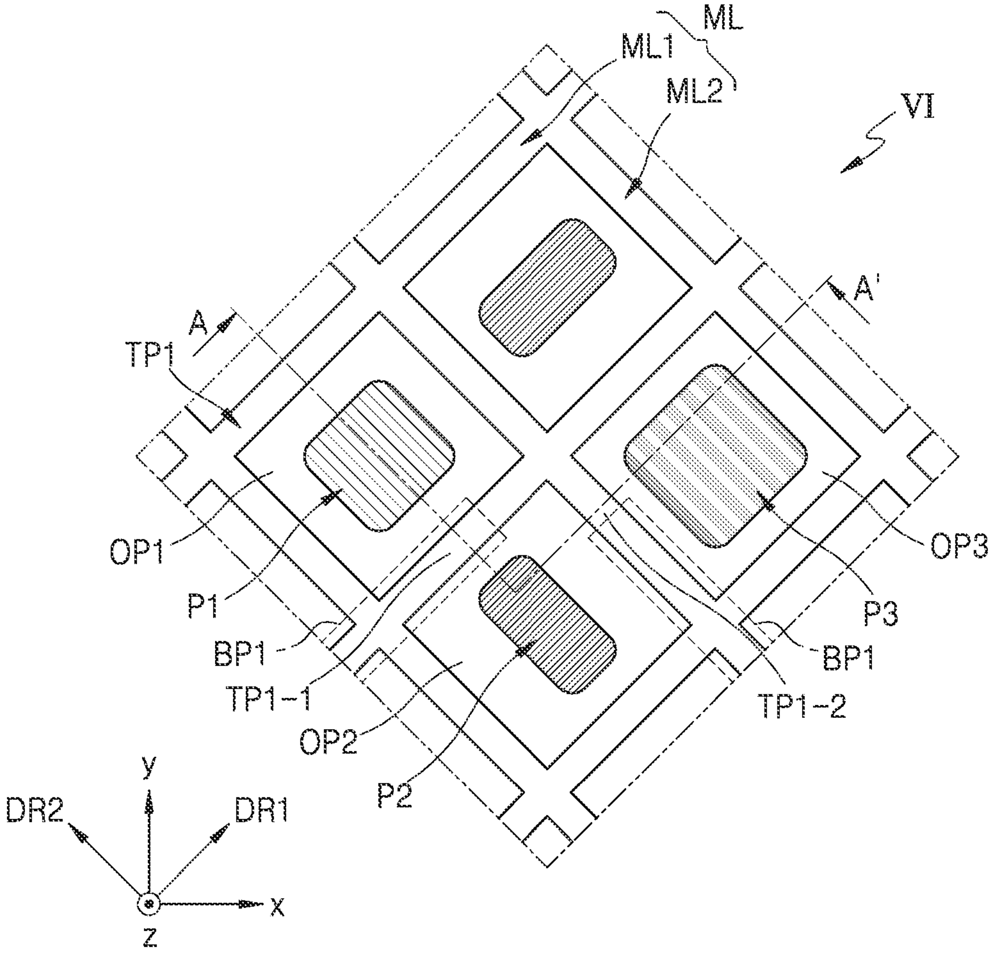
FIG. 6 is an enlarged plan view illustrating a region VI of the display apparatus shown in FIG. 4.

FIG. 6 is an enlarged plan view illustrating a region VI of the display apparatus 1 shown in FIG. 4.

Referring to FIG. 6, the first touch pattern TP1 may have a mesh shape and may define a plurality of openings. For example, the first touch pattern TP1 may include mesh lines ML, and the mesh lines ML may include first mesh lines ML1 extending in the first direction DR1 and second mesh lines ML2 extending in the second direction DR2. The first and second mesh lines ML1 and ML2 may be configured to define first through third openings OP1, OP2, and OP3.

A corresponding sub-pixel may be arranged in each opening defined through the mesh lines ML of the first touch pattern TP1. For example, first through third sub-pixels P1, P2, and P3 may be arranged in the first through third openings OP1, OP2, and OP3, respectively.

FIG. 6 also shows first through third sub-pixels P1, P2, and P3. The first through third sub-pixels P1, P2, and P3 may emit light having different colors. For example, the first sub-pixel P1 may emit red light, the second sub-pixel P2 may emit green light, and the third sub-pixel P3 may emit blue light.

One of the first bridge patterns BP1 may be disposed between the first sub-pixel P1 and the second sub-pixel P2. For example, a part of one of the first bridge patterns BP1 may extend in the first direction DR1, and some of the first bridge patterns BP1 may be arranged between the first sub-pixel P1 and the second sub-pixel P2. A portion of the first bridge pattern BP1 may overlap the first opening OP1 and/or the second opening OP2.

Another one of the first bridge patterns BP1 may include a portion extending between the second sub-pixel P2 and the third sub-pixel P3. For example, a portion of another one of the first bridge patterns BP1 may extend in the second direction DR2 and may be arranged between the second sub-pixel P2 and the third sub-pixel P3. A portion of the first bridge patterns BP1 may overlap the second opening OP2 and/or the third opening OP3.

A portion of the first touch patterns TP1, for example, a first conductive line TP1-1 may overlap the first bridge patterns BP1 and may extend in the first direction DR1. A portion of the first conductive line TP1-1 may be disposed between the first sub-pixel P1 and the second sub-pixel P2.

Another portion of the first touch patterns TP1, for example, a second conductive line TP1-2 may overlap the first bridge patterns BP1 and may extend in the second direction DR2. A portion of the second conductive line TP1-2 may be disposed between the second sub-pixel P2 and the third sub-pixel P3.

FIGS. 7 through 11 are cross-sectional views illustrating the display apparatus 1 taken along a line A-A' of FIG. 6 according to various embodiments.

Figure 7:
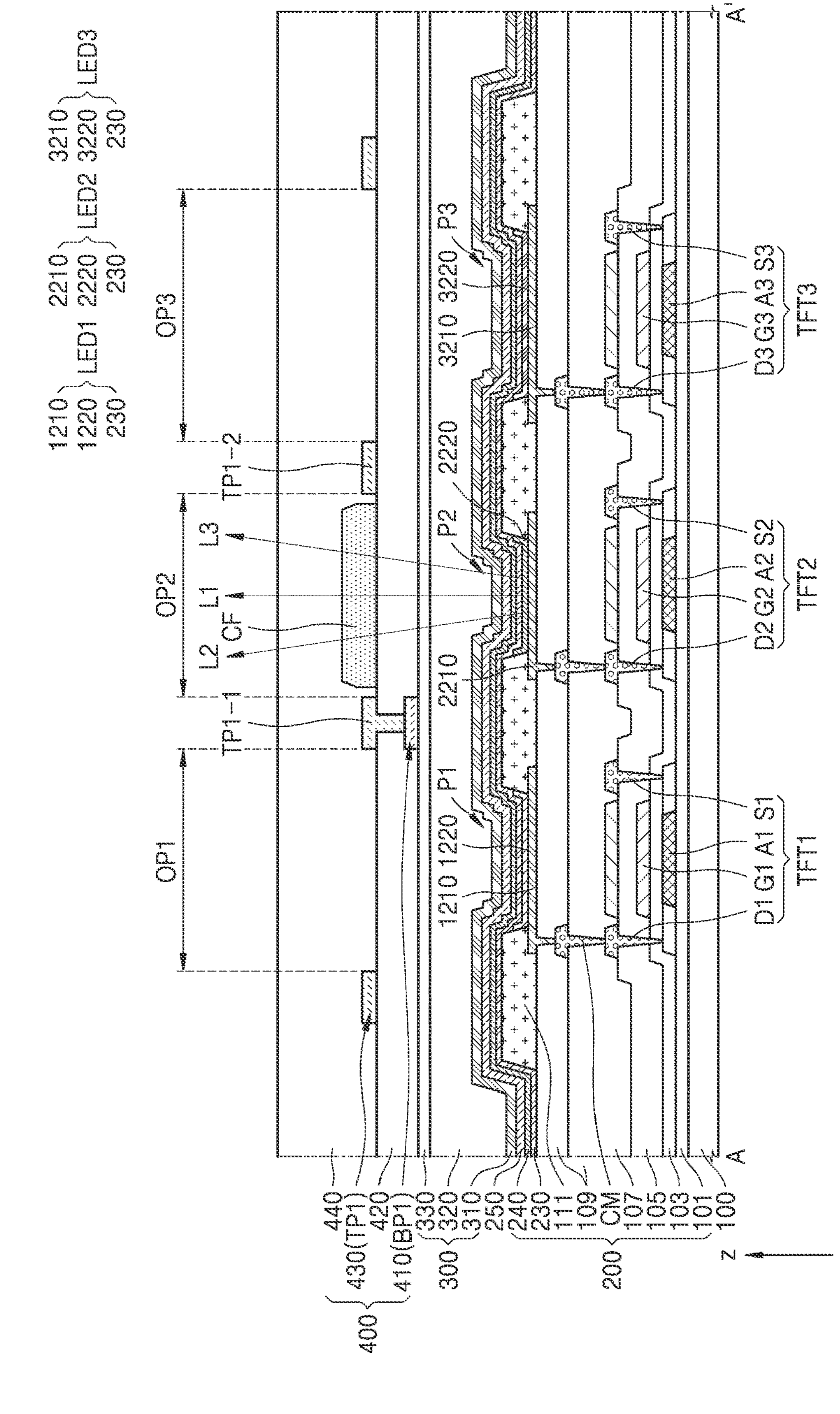
FIG. 7, FIG. 8, FIG. 9, FIG. 10, and FIG. 11 are cross-sectional views of the display apparatus taken along a line A-A' of FIG. 6 according to various embodiments.

FIG. 7 is a cross-sectional view illustrating the display apparatus 1 taken along a line A-A' of FIG. 6 according to an embodiment.

Referring to FIG. 7, a display element layer 200 including a plurality of sub-pixels may be arranged on the substrate 100. In an embodiment, the first through third sub-pixels P1, P2, and P3 may be arranged on the substrate 100. The first through third sub-pixels P1, P2, and P3 may include first through third light-emitting diodes LED1, LED2, and LED3 that emit light of certain colors.

The first through third light-emitting diodes LED1, LED2, and LED3 may include first through third sub-pixel electrodes 1210, 2210, 3210, and first through third intermediate layers 1220, 2220, and 3220, which correspond to the first through third light-emitting diodes LED1, LED2, and LED3, respectively.

The substrate 100 may include glass or polymer resin. The substrate 100 including the polymer resin may have flexible, rollable or bendable characteristics. The substrate 100 may have a multi-layered structure including a layer including the above-described polymer resin and an inorganic layer (not shown).

The first through third intermediate layers 1220, 2220, and 3220 corresponding to the first through third sub-pixels P1, P2, and P3, respectively, may be electrically connected to first through third thin-film transistors TFT1, TFT2, and TFT3 on the substrate 100.

The first intermediate layer 1220 corresponding to the first sub-pixel P1 may be electrically connected to the first thin-film transistor TFT1 through the first sub-pixel electrode 1210. The first thin-film transistor TFT1 may include a first active layer A1, a first gate electrode G1 that overlaps a portion of the first active layer A1, and a first source electrode S1 and a first drain electrode D1 that are in contact with a portion of the first active layer A1.

The second intermediate layer 2220 corresponding to the second sub-pixel P2 may be electrically connected to the second thin-film transistor TFT2 through the second sub-pixel electrode 2210. The second thin-film transistor TFT2 may include a second active layer A2, a second gate electrode G2 that overlaps a portion of the second active layer A2, and a second source electrode S2 and a second drain electrode D2 that are in contact with a portion of the second active layer A2.

The third intermediate layer 3220 corresponding to the third sub-pixel P3 may be electrically connected to the third thin-film transistor TFT3 through the third sub-pixel electrode 3210. The third thin-film transistor TFT3 may include a third active layer A3, a third gate electrode G3 that overlaps a portion of the third active layer A3, and a third source electrode S3 and a third drain electrode D3 that are in contact with a portion of the third active layer A3.

The first through third gate electrodes G1, G2, and G3 may include at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may have a single layer or multi-layered structure including the above-described materials.

A buffer layer 101 for preventing penetration of impurities may be between the first through third active layers A1, A2, and A3 and the substrate 100. A gate insulating layer 103 may be between the first through third active layers A1, A2, and A3 and the first through third gate electrodes G1, G2, and G3. An interlayer insulating layer 105 may be disposed on the first through third gate electrodes G1, G2, and G3. The buffer layer 101, the gate insulating layer 103, and the interlayer insulating layer 105 may include an inorganic insulating material such as silicon oxide ($SiO_x$), silicon nitride ($SiN_x$), silicone oxynitride (SiON), aluminum oxide ($AlO_x$), aluminum nitride ($AlN_x$), titanium oxide ($TiO_x$), or titanium nitride ($TiN_x$).

The first through third source electrodes S1, S2, and S3 may be arranged on the interlayer insulating layer 105 and may be connected to the first through third active layers A1, A2, and A3, respectively, through contact holes formed in the interlayer insulating layer 105 and the gate insulating layer 103. The first through third source electrodes S1, S2, and S3 may include Al, Pt, Pd, Ag, Mg, Au, Ni, Nd, Ir, Cr, Li, Ca, Mo, Ti, W, and Cu and may have a single layer or multi-layered structure.

The first through third drain electrodes D1, D2, and D3 may be arranged on the interlayer insulating layer 105 and may be connected to the first through third active layers A1, A2, and A3, respectively, through contact holes formed in the interlayer insulating layer 105 and the gate insulating layer 103. The first through third drain electrodes D1, D2, and D3 may include Al, Pt, Pd, Ag, Mg, Au, Ni, Nd, Ir, Cr, Li, Ca, Mo, Ti, W, and Cu, and may have a single layer or multi-layered structure. In some embodiments, the first through third source electrodes S1, S2, and S3 and the first through third drain electrodes D1, D2, and D3 may include the same materials.

The first organic insulating layer 107 may be disposed on the first through third thin-film transistors TFT1, TFT2, and TFT3. For example, the first organic insulating layer 107 may be disposed to cover the first through third source electrodes S1, S2, and S3 and the first through third drain electrodes D1, D2, and D3. The first organic insulating layer 107 may include an organic insulating material such as acryl, benzocyclobutene, polyimide or hexamethyldisiloxane. The first organic insulating layer 107 may include a plurality of contact holes. For example, the first organic insulating layer 107 may include a plurality of contact holes that overlap the first through third drain electrodes D1, D2, and D3, respectively.

A contact metal CM may be disposed on the first organic insulating layer 107. The contact metal CM may include Al, Cu and/or Ti and may have a single layer or multi-layered structure including the above-described materials. The contact metal CM may include multiple regions, and the regions of the contact metal CM may respectively overlap the first through third drain electrodes D1, D2, and D3. A part of each region of the contact metal CM may be arranged in a contact hole formed in the first organic insulating layer 107. For example, regions of the contact metal CM may respectively be in contact with the first through third drain electrodes D1, D2, and D3 through the contact holes formed in the first organic insulating layer 107.

The second organic insulating layer 109 may be between the first organic insulating layer 107 and the first through third sub-pixel electrodes 1210, 2210, and 3210. The second organic insulating layer 109 may include an organic insulating material such as acryl, benzocyclobutene, polyimide or hexamethyldisiloxane. The second organic insulating layer 109 may include contact holes overlapping the regions of the contact metals CM, respectively.

The first through third sub-pixel electrodes 1210, 2210, and 3210 may be arranged on the second organic insulating layer 109. The first through third sub-pixel electrodes 1210, 2210, and 3210 may be formed to be reflection electrodes. The first through third sub-pixel electrodes 1210, 2210, and 3210 may be formed by forming reflection layers including Ag, Mg, Al, Pt, Pd, Au, Ni, Nd, Ir, Cr or a compound thereof and by arranging a layer formed of ITO, IZO, ZnO or $In_2O_3$ on the reflection layer. In an embodiment, the first through third sub-pixel electrodes 1210, 2210, and 3210 may have a structure in which an ITO layer, an Ag layer and an ITO layer are sequentially stacked. Of course, embodiments are not limited thereto, and the first through third sub-pixel electrodes 1210, 2210, and 3210 may be formed of various materials, and a structure of the first through third sub-pixel electrodes 1210, 2210, and 3210 may be variously modified, including being a single layer or multi-layered structure.

The first through third sub-pixel electrodes 1210, 2210, and 3210 may be electrically connected through contact holes formed in the second organic insulating layer 109 to regions of the contact metal CM that respectively overlap the first through third sub-pixel electrodes 1210, 2210, and 3210.

According to an embodiment described with reference to FIG. 7, the first through third thin-film transistors TFT1, TFT2, and TFT3 and the first through third sub-pixel electrodes 1210, 2210, and 3210 are electrically connected to one another via regions of the contact metal CM. However, embodiments are not limited thereto. In another embodiment, the contact metal CM may be omitted, and one organic insulating layer may be between the first through third thin-film transistors TFT1, TFT2, and TFT3, and the first through third sub-pixel electrodes 1210, 2210, and 3210. Alternatively, three or more organic insulating layers may be between the first through third thin-film transistors TFT1, TFT2, and TFT3 and the first through third sub-pixel electrodes 1210, 2210, and 3210, and the first through third thin-film transistors TFT1, TFT2, and TFT3 and the first through third sub-pixel electrodes 1210, 2210, and 3210 may be electrically connected to one another via a plurality of metal contacts.

A sub-pixel defining layer 111 may cover edge regions (or edges) of the first through third sub-pixel electrodes 1210, 2210, and 3210. In other words, the sub-pixel defining layer 111 may include a plurality of openings for exposing the center of each of the first through third sub-pixel electrodes 1210, 2210, and 3210. Each opening of the sub-pixel defining layer 111 may be configured to define emission regions of the first through third sub-pixels P1, P2, and P3.

First through third intermediate layers 1220, 2220, and 3220 may be arranged on the first through third sub-pixel electrodes 1210, 2210, and 3210. For example, the first intermediate layer 1220 may be arranged on the first sub-pixel electrode 1210 in the opening of the sub-pixel defining layer 111. The second intermediate layer 2220 may be arranged on the second sub-pixel electrode 2210 in the opening of the sub-pixel defining layer 111. The third intermediate layer 3220 may be arranged on the third sub-pixel electrode 3210 in the opening of the sub-pixel defining layer 111.

The first through third intermediate layers 1220, 2220, and 3220 may include an organic emission layer including a low molecular weight or polymer material. The first through third intermediate layers 1220, 2220, and 3220 may have a structure in which a hole injection layer (HIL), a hole transport layer (HTL), an emission layer (EML), an electron transport layer (ETL) and/or electron injection layer (EIL) are stacked on each other in a single or composite structure.

An opposite electrode 230 may be arranged on the first through third intermediate layers 1220, 2220, and 3220. The opposite electrode 230 may be formed integrally to cover the first through third intermediate layers 1220, 2220, and 3220. The opposite electrode 230 may be formed as a transparent or semitransparent electrode. When the opposite electrode 230 is formed as a transparent or semitransparent electrode, the opposite electrode 230 may include one or more materials selected from the group consisting of Ag, Al, Mg, Li, Ca, Cu, lithium fluoride (LiF)/Ca, LiF/Al, MgAg, and CaAg, and may have a thin-film shape with a thickness of several to several tens of nm. Of course, the configuration and material of the opposite electrode 230 are not limited to these examples, and various modifications are possible.

A capping layer 240 may be arranged on the first through third light-emitting diodes LED1, LED2, and LED3. In an embodiment, the capping layer 240 may cover the opposite electrode 230. In an embodiment, the capping layer 240 may be configured to improve the emission efficiency of the first through third light-emitting diodes LED1, LED2, and LED3 based on the principle of reinforcement interference.

The capping layer 240 may be an organic capping layer including an organic material, an inorganic capping layer including an inorganic material, or a composite capping layer including an organic material and an inorganic material. For example, the capping layer 240 may include a carbocyclic compound, a heterocyclic compound, an amine group-containing compound, porphine derivatives, phthalocyanine derivatives, naphthalocyanine derivatives, an alkaline metal complex, an alkali earth metal complex, or any combination thereof.

A low reflection layer 250 may be arranged on the capping layer 240. Since the capping layer 240 may be disposed on the first through third light-emitting diodes LED1, LED2, and LED3, it may also be understood that the low reflection layer 250 may be arranged on the first through third light-emitting diodes LED1, LED2, and LED3. The low reflection layer 250 may include an inorganic material having a comparatively low reflectivity, and in an embodiment, the low reflection layer 250 may include metal or a metal oxide. When the low reflection layer 250 includes metal, the metal may include, for example, ytterbium (Yb), bismuth (Bi), Co, Mo, Ti, zirconium (Zr), Al, Cr, niobium (Nb), Pt, W, indium (In), tin (Sn), iron (Fe), Ni, tantalum (Ta), manganese (Mn), zinc (Zn), germanium (Ge), silver (Ag), Mg, Au, Cu, Ca or a compound thereof. When the low reflection layer 250 includes a metal oxide, the metal oxide may include, for example, $TiO_2$, $ZrO_2$, $Ta_2O_5$, $HfO_2$, $Al_2O_3$, ZnO, $Y_2O_3$, BeO, MgO, $PbO_2$, $WO_3$ or a compound thereof. Of course, embodiments are not limited thereto, and the material for forming the low reflection layer 250 may be variously modified.

The encapsulation layer 300 may be disposed on the low reflection layer 250. The encapsulation layer 300 may include at least one inorganic encapsulation layer and at least one organic encapsulation layer. For example, as shown in FIG. 7, the encapsulation layer 300 may include a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first inorganic encapsulation layer 310 and the second inorganic encapsulation layer 330 may have a single layer or multi-layered structure including the above-described materials.

The organic encapsulation layer 320 may be configured to alleviate the internal stress of the first inorganic encapsulation layer 310 and/or the second inorganic encapsulation layer 330. The organic encapsulation layer 320 may include a polymer-based material. For example, the organic encapsulation layer 320 may include polyethylene terephthalate, polyethylene naphalate, polycarbonate, polyimide, polyethylene sulponate, polyoxymethylene, polyarylate, hexamethyldisiloxane (HMDSO), acryl-based resin (e.g., polymethylmethacrylate, polyacrylic acid, etc.) or any combination thereof.

The encapsulation layer 300 may have a multi-layered structure of the first inorganic encapsulation layer 310, the organic encapsulation layer 320, and the second inorganic encapsulation layer 330. In this case, even when cracks occur in the encapsulation layer 300, cracks may not be propagated between the first inorganic encapsulation layer 310 and the organic encapsulation layer 320 or between the organic encapsulation layer 320 and the second inorganic encapsulation layer 330. The encapsulation layer 300 may prevent or minimize external moisture or oxygen from penetrating into the display element layer 200.

The input sensing layer 400 may be disposed on the encapsulation layer 300. The input sensing layer 400 may include a first touch electrode layer 410, a touch insulating layer 420, a second touch electrode layer 430, and a planarization layer 440. The first touch electrode layer 410 may be directly arranged on the encapsulation layer 300. For example, the first touch electrode layer 410 may be directly arranged on the second inorganic encapsulation layer 330 of the encapsulation layer 300. However, embodiments are not limited thereto.

In another embodiment, the input sensing layer 400 may include an insulating film (not shown) between the first touch electrode layer 410 and the encapsulation layer 300. In this case, the insulating layer may be disposed on the second inorganic encapsulation layer 330 of the encapsulation layer 300 and may planarize a surface on which the first touch electrode layer 410 is disposed. The insulating film may include an inorganic insulating material such as silicon oxide ($SiO_x$), silicon nitride ($SiN_x$), silicon oxynitride (SiON), or the like. In some embodiments, the insulating film may also include an organic insulating material.

A touch insulating layer 420 may be disposed on the first touch electrode layer 410. The touch insulating layer 420 may include an inorganic material or an organic material. When the touch insulating layer 420 includes an inorganic material, the touch insulating layer 420 may include at least one material selected from the group consisting of silicon nitride ($SiN_x$), aluminum nitride ($AlN_x$), zirconium nitride ($ZrN_x$), titanium nitride ($TiN_x$), hafnium nitride ($HfN_x$), tantalum nitride ($TaN_x$), silicon oxide ($SiO_x$), aluminum oxide ($AlO_x$), titanium oxide ($TiO_x$), zinc oxide ($ZnO_x$), cerium oxide ($CeO_x$), and silicon oxynitride (SiON). When the touch insulating layer 420 includes an organic material, the touch insulating layer 420 may include at least one material selected from the group including an acryl-based resin, methacryl-based resin, polyisophrene, a vinyl-based resin, an epoxy-based resin, a urethane-based resin, a cellulose-based resin, and a parylene-based resin.

A second touch electrode layer 430 may be disposed on the touch insulating layer 420. The second touch electrode layer 430 may serve as a sensor to detect the user's touch input. The first touch electrode layer 410 may serve as a connector connecting the touched second touch electrode layer 430 in one direction. For example, the first touch electrode layer 410 may include the first bridge pattern BP1, and the second touch electrode layer 430 may include the first touch pattern TP1. The first bridge pattern BP1 may connect the first touch patterns TP1 to each other (see FIGS. 4 and 5).

In an embodiment, the first touch electrode layer 410 and the second touch electrode layer 430 may have a structure through which light emitted from the first through third light-emitting diodes LED1, LED2, and LED3 may pass, for example, a mesh structure. (See FIGS. 4 and 6.) In an embodiment, the second touch electrode layer 430 may include first through third openings OP1, OP2, and OP3 that overlap the first through third light-emitting diodes LED1, LED2, and LED3.

The first touch electrode layer 410 and the second touch electrode layer 430 may include a metal layer or a transparent conductive layer. The metal layer may include Mo, Ag, Ti, Cu, Al, and an alloy thereof. The transparent conductive layer may include a transparent conductive oxide such as indium tin oxide (ITO), indium zinc oxide (IZO), zinc oxide (ZnO), indium tin zinc oxide (ITZO), a conductive polymer such as PEDOT, metal nanowires, carbon nanotubes or graphene.

A planarization layer 440 may be disposed on the second touch electrode layer 430. The planarization layer 440 may include an inorganic material or an organic material. When the planarization layer 440 includes an inorganic material, the touch insulating layer 420 may include at least one material selected from the group consisting of silicon nitride ($SiN_x$), aluminum nitride ($AlN_x$), zirconium nitride ($ZrN_x$), titanium nitride ($TiN_x$), hafnium nitride ($HfN_x$), tantalum nitride ($TaN_x$), silicon oxide ($SiO_x$), aluminum oxide ($AlO_x$), titanium oxide ($TiO_x$), zinc oxide ($ZnO_x$), cerium oxide ($CeO_x$), and silicon oxynitride (SiON). When the planarization 440 includes an organic material, the planarization layer 440 may include at least one material selected from the group including an acryl-based resin, methacryl-based resin, polyisophrene, a vinyl-based resin, an epoxy-based resin, a urethane-based resin, a cellulose-based resin, and a parylene-based resin.

The planarization layer 440 may include a plurality of layers including different materials. For example, the planarization layer 440 may have a multi-layered structure including a first planarization layer disposed on the second touch electrode layer 430 and including silicon oxide ($SiO_x$) and a second planarization layer disposed on the first planarization layer and including an acryl-based resin.

A first conductive line TP1-1 and a second conductive line TP1-2 of the first touch patterns TP1 of the second touch electrode layer 430 may be spaced apart from each other with the second light-emitting diode LED2 therebetween. A second opening OP2 may be disposed between the first conductive line TP1-1 and the second conductive line TP1-2. The first conductive line TP1-1 may be connected to the first bridge pattern BP1 of the first touch electrode layer 410 through a contact hole formed in the touch insulating layer 420. Although not shown in FIG. 7, the second conductive line TP1-1 may also be connected to the first bridge pattern BP1 through a contact hole formed in the touch insulating layer 420.

A color filter layer CF may be between the touch insulating layer 420 and the planarization layer 440. For example, the color filter layer CF may be disposed between the first conductive line TP1-1 and the second conductive line TP1-2 in the plan view, on the touch insulating layer 420, and covered by the planarization layer 440. A portion of the color filter layer CF may be disposed in the second opening OP2.

The color filter layer CF may correspond to the second light-emitting diode LED2 and may not be disposed on the first and third light-emitting diodes LED1 and LED3. Thus, in the area on the first and second light-emitting devices LED1 and LED3, the touch insulating layer 420 and the planarization layer 440 may be in direct contact with each other. For example, the touch insulating layer 420 and the planarization layer 440 may be in direct contact with each other within the first opening OP1. The touch insulating layer 420 and the planarization layer 440 may be in direct contact with each other within the third opening OP3.

A side surface of the color filter layer CF may be spaced apart from the first conductive line TP1-1 and the second conductive line TP1-2. In other words, the width of the color filter layer CF may be less than the width of the second opening OP2. The touch insulating layer 420 and the planarization layer 440 may be in direct contact with each other in a partial region of the second opening OP2 surrounding the color filter layer CF.

FIG. 7 illustrates that the thickness of the color filter layer CF may be greater than the thickness of the second touch electrode layer 430, for example, the first and second conductive lines TP1-1 and TP1-2. However, embodiments are not limited thereto. In another embodiment, the thickness of the color filter layer CF may be less than the thickness of the first and second conductive lines TP1-1 and TP1-2, and all portions of the color filter layer CF may be disposed in the second opening OP2.

The second sub-pixel P2 may emit light of a certain color, for example, green light. Light emitted from the second sub-pixel P2 may include first light L1, sometimes referred to as front light, which proceeds in a direction perpendicular to the upper surface of the substrate 100, for example, a +z direction. In addition, light emitted from the second sub-pixel P2 may include side light such as second light L2 and third light L3, which is emitted with a certain angle (for example, 45 degrees) with respect to the upper surface of the substrate 100. In an embodiment, an angle between the second light L2 or the third light L3 and the upper surface of the substrate 100 may be 45 degrees. Thus, an angle between the first light L1 and the second light L2 may be 45 degrees, and an angle between the first light L1 and the third light L3 may be 45 degrees.

The luminance of side light with respect to luminance of front light may be illustrated with a Luminance versus Angle (LvA) plot. In this case, the front light means light emitted vertically from the upper surface of a light source (e.g., a light-emitting device), and the side light means light emitted with a certain angle from the upper surface of the light source.

In the present specification, the front light may mean light emitted in a direction (e.g., +z direction) perpendicular to the upper surface of the substrate 100 (or the upper surface of the second light-emitting device LED2) from the second light-emitting device LED2. In the present specification, the side light may mean light emitted with a certain angle (e.g., 45 degrees) with respect to the upper surface of the substrate 100 (or the upper surface of the second light-emitting device LED2) from the second light-emitting device LED2. For example, the first light L1 shown in FIGS. 7 through 11 may be the front light, and the second light L2 and the third light L3 may be the side light.

In the present specification, LvA may mean the ratio of a luminance of the second light L2 with respect to a luminance of the first light L1, or the ratio of a luminance of the third light L3 with respect to the luminance of the first light L1. For example, LvA may be understood as a value obtained by dividing the luminance of the second light L2 by the luminance of the first light L1, or a value obtained by the luminance of the third light L3 by the luminance of the first light L1.

The luminance of the side light may be lower than the luminance of the front light. For example, the luminance of the second light L2 or the third light L3 may be lower than the luminance of the first light L1. Thus, a value of LvA may be expressed as a ratio that is less than 1 (or as a percentage that is less than 100%). For example, if the color filter layer CF is not disposed in the path of emitted light, LvA may be about 35% to about 45%.

A wavelength range or luminance distribution of the side light may differ from the wavelength range or luminance distribution of the front light. For example, the center wavelength of the luminance distribution of the side light (or a wavelength having a maximum luminance) may be shorter than the center wavelength of the luminance distribution of the front light. The luminance distribution of the side light may not coincide with the luminance distribution of the front light and may be shifted toward shorter wavelengths. (See FIG. 12.) Thus, the respective luminance distributions of the side light and the front light may differ from each other, so that colors of the side light and the front light may be different from each other. This may cause a phenomenon in which an image provided by the display apparatus is seen differently in color when the image is seen from the front and when the image is seen at a certain angle, respectively.

The color filter layer CF may include a material through which green light selectively transmits. For example, the color filter layer CF may include a material for which the center wavelength of its transmission distribution is in the range of about 520 nanometers (nm) to about 530 nm.

The color filter CF may selectively transmit light with peak wavelengths in the luminance distribution of the second light L2 or the third light L3, so that the color filter CF preferentially transmits a portion of the first light L1 having wavelengths corresponding to the second light L2 or the third light L3. Light that does not overlap the dominant wavelength range of the second light L2 or the third light L3 in the wavelength range of the first light L1 may not transmit or may only partially transmit through the color filter layer CF.

The color filter layer CF may cause several effects, and three examples thereof are described below.

First, the color filter layer CF may prevent light in a certain wavelength range in the luminance distribution of the first light L1 from transmitting through the color filter layer CF, or only a part of the light in the certain wavelength range in the luminance distribution of the first light L1 may transmit through the color filter layer CF. In this case, the luminance of the first light L1 may be entirely, i.e., across all wavelengths, decreased, and LvA may be increased. In some embodiments, LvA of the display apparatus according to an embodiment to which the color filter layer CF is applied may be about 60% or more. In an embodiment, LvA of the display apparatus according to an embodiment to which the color filter layer CF is applied may be about 60.6% or more.

Second, the color filter CF may shift the luminance distribution of the first light L1 closer to the luminance distribution of the second light L2 or the third light L3. (See FIG. 13.) Thus, by applying the color filter layer CF, a wavelength difference (or a color difference) between the front light (e.g., the first light L1) and the side light (e.g., the second light L2 or the third light L3) may be reduced.

Third, when a color filter blocks or does not transmit light in a certain wavelength range, the luminance of light may be entirely reduced due to the transmittance of the color filter. In the case of the color filter layer CF according to an embodiment, a maximum transmittance, for example, a transmittance in the center wavelength may be 90% or more. (See FIG. 14.) Thus, when the color filter layer CF according to an embodiment is applied, the above-described effects, e.g., increasing the luminance ratio and decreasing a color difference between the front light and the side light, may be achieved without greatly decreasing the luminance of all of the first through third light L1, L2, and L3.

Of course, the above-described effects are examples, and embodiments are not limited by these effects.

Figure 8:
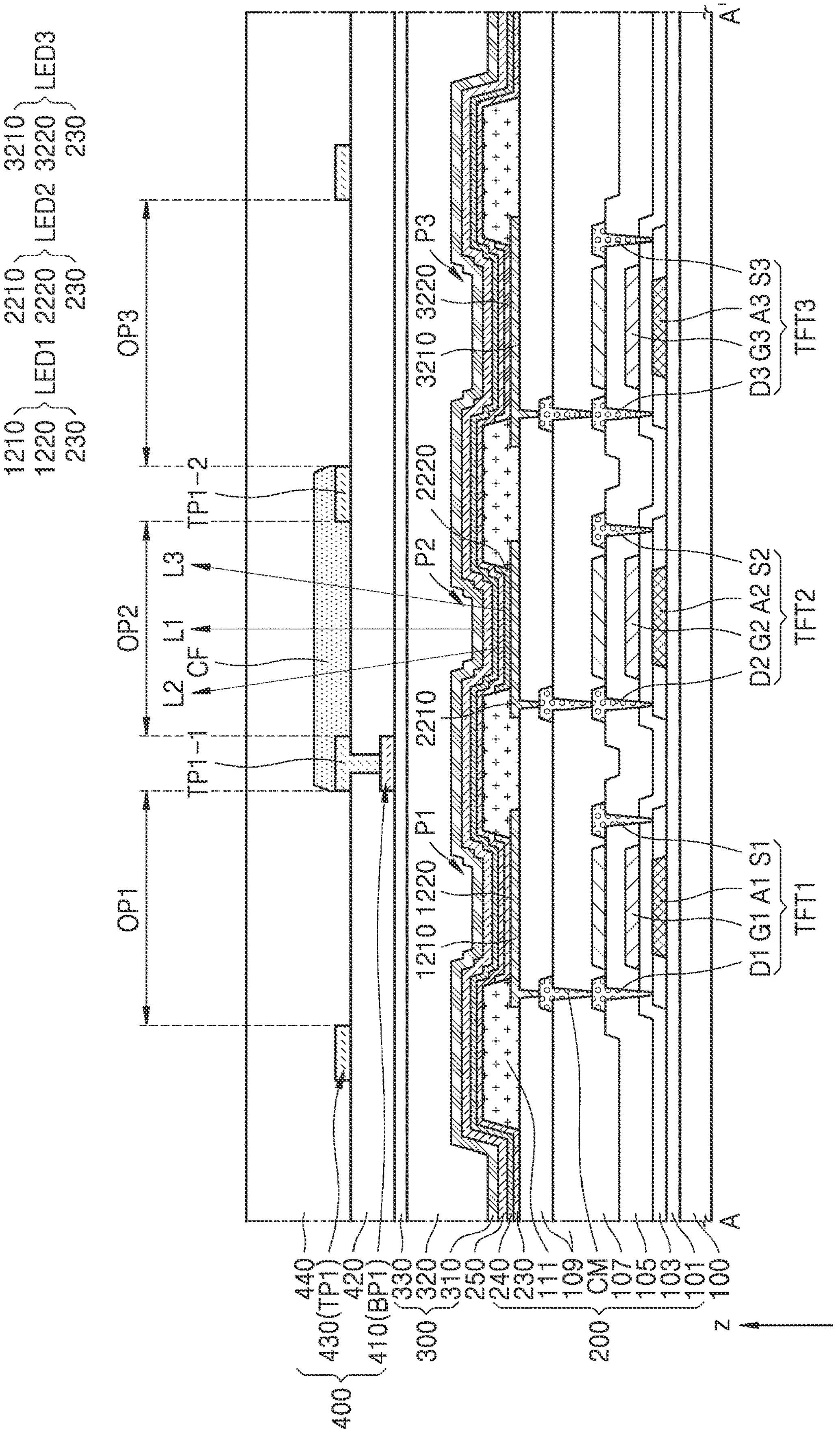

FIG. 8 is a cross-sectional view illustrating the display apparatus taken along a line A-A' of FIG. 6 according to another embodiment. The embodiment of FIG. 8 differs from the embodiment of FIG. 7 primarily in that the size or shape of the color filter layer CF of FIG. 8 may differ from the size or shape of the color filter layer CF of FIG. 7. Other elements of FIG. 8 may be substantially the same as those described above with reference to FIG. 7.

Referring to FIG. 8, the color filter layer CF may cover the upper surface of the first conductive line TP1-1 and/or the second conductive line TP1-2. For example, a portion of the color filter layer CF may be disposed in the second opening OP2. Another portion of the color filter layer CF may protrude from the upper surface of the second opening OP2, and a portion thereof may be arranged on the first conductive line TP1-1 or the second conductive line TP1-2.

In an embodiment, one side surface of the color filter layer CF may be present on the same plane as the side surface of the first conductive line TP1-1 or the second conductive line TP1-2. For example, a portion of the color filter layer CF may be disposed on the first conductive line TP1-1, and the side surface of the color filter layer CF may form the same plane or continuous surface as the side surface of the first conductive line TP1-1. Another portion of the color filter layer CF may be disposed on the second conductive line TP1-2, and the side surface of the color filter layer CF may form the same plane or continuous surface as the side surface of the second conductive line TP1-2.

In another embodiment, the color filter layer CF may extend beyond the edge of the first conductive line TP1-1 or the second conductive line TP1-2. In other words, the first conductive line TP1-1 or the second conductive line TP1-2 may be covered by the color filter layer CF.

FIG. 8 illustrates that the color filter layer CF covers both the upper surface of the first conductive line TP1-1 and the upper surface of the second conductive line TP1-2. However, embodiments are not limited thereto. In another embodiment, the color filter layer CF may cover only the upper surface of just one of the first conductive line TP1-1 and the second conductive line TP1-2 or may only partially cover the upper surface of the first conductive line TP1-1 or the second conductive line TP1-2.

The second opening OP2 may be entirely filled by the color filter layer CF. In other words, the touch insulating layer 420 and the planarization layer 440 may not be in direct contact with each other in an area overlapping the second opening OP2.

The effect of the color filter layer CF shown in FIG. 8 may be similar to the effect of the color filter layer CF shown in FIG. 7. Unlike in the embodiment of FIG. 7, in an embodiment of FIG. 8, the color filter layer CF is configured to entirely cover the second opening OP2 so that all or more light emitted from the second light-emitting device LED2 and passing through the second opening OP2 may be affected by the color filter layer CF. Thus, the effects of the color filter layer CF described above may be greater than the effects of the embodiment shown in FIG. 8 than the embodiment shown in FIG. 7.

Figure 9:
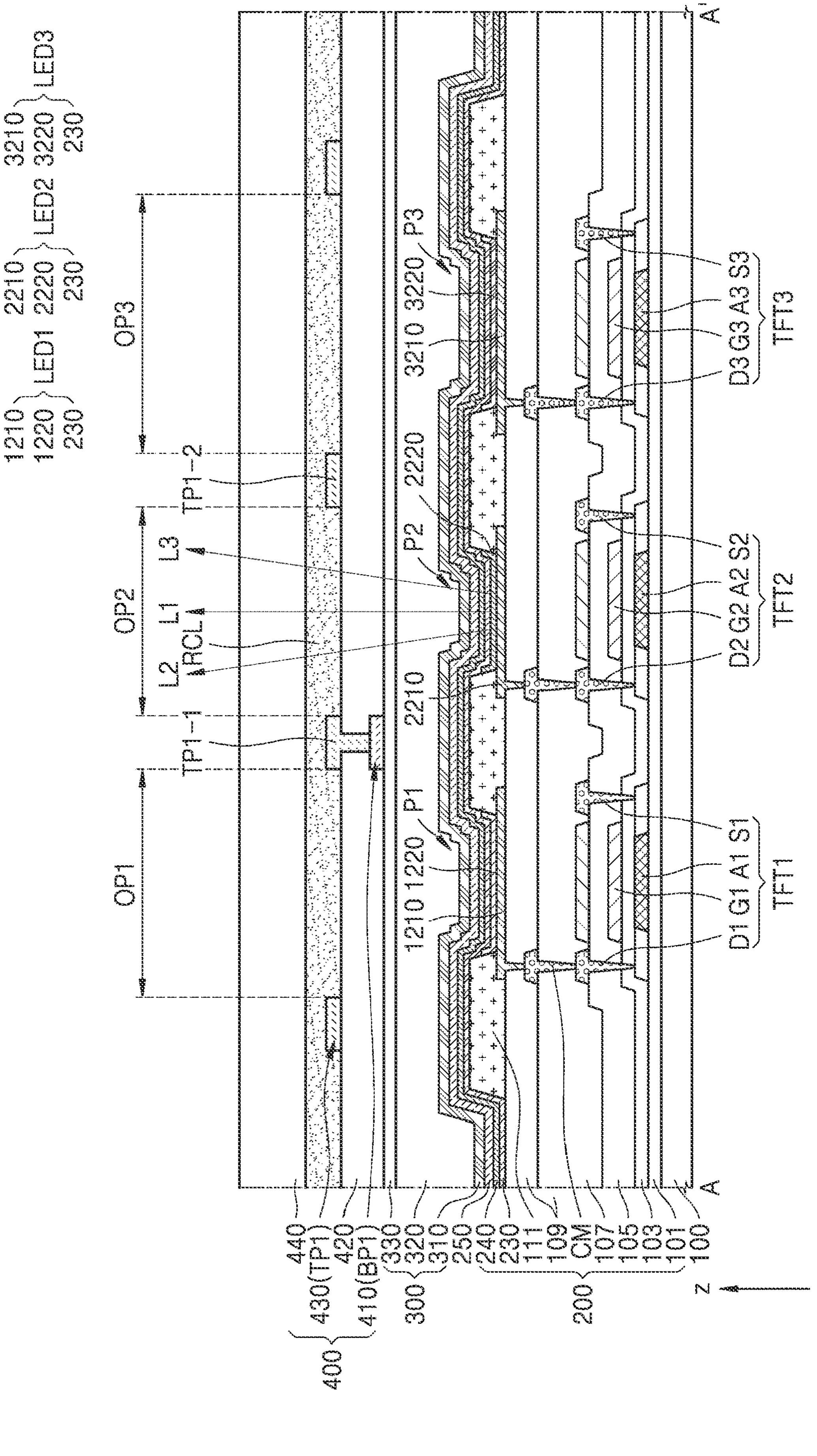

FIG. 9 is a cross-sectional view illustrating the display apparatus taken along a line A-A' of FIG. 6 according to another embodiment. The embodiment of FIG. 9 differs from the embodiment of FIG. 7 primarily in that a reflection adjustment layer RCL of FIG. 9 replaces the color filter layer CF of FIG. 7. Other elements of FIG. 9 may be substantially the same as those described above with reference to FIG. 7.

Referring to FIG. 9, the reflection adjustment layer RCL may be disposed on the touch insulating layer 420 and the second touch electrode layer 430.

In an embodiment, the reflection adjustment layer RCL may cover the touch insulating layer 420 and the second touch electrode layer 430. The reflection adjustment layer RCL may be covered by the planarization layer 440 disposed on the reflection adjustment layer RCL.

The reflection adjustment layer RCL may include a material that absorbs light in a certain wavelength range. For example, the reflection adjustment layer RCL may include absorbent metal, an inorganic material, an organic material, inorganic dyes, or organic dyes. In one embodiment, the reflection adjustment layer RCL may include porphyrin dyes.

The reflection adjustment layer RCL may absorb or attenuate light in a wavelength range of about 580 nm to about 600 nm. For example, the reflection adjustment layer RCL may include a material having a wavelength with a minimum transmittance, i.e., the center wavelength of 585 nm or 595 nm.

A portion of the first light L1 with wavelengths in the wavelength range of the second light L2 or the third light L3 may transmit through the reflection adjustment layer RCL. The reflection adjustment layer RCL may centrally absorb light having wavelengths in the luminance distribution of the first light L1 that do not as strongly overlap the luminance distribution of the second light L2 or the third light L3.

Light in the wavelength range that is greater than the wavelength at which the luminance distribution of the second light L2 or the third light L3 peaks, for example, about 585 nm to about 595 nm in the wavelength range of the first light L1 may be absorbed by the reflection adjustment layer RCL.

Thus, the reflection adjustment layer RCL may cause similar effects as those of the color filter layer CF shown in FIG. 7 or 8. For example, the reflection adjustment layer RCL may be arranged so that light in a certain wavelength range of the wavelength range of the first light L1 may be absorbed or attenuated by the reflection adjustment layer RCL and may not pass or only a part thereof may pass. Thus, the luminance of the first light L1 may be entirely reduced so that an LvA may be increased. In some embodiments, the LvA of the display apparatus according to an embodiment to which the reflection adjustment layer RCL is applied, may be about 60% or more. In an embodiment, the LvA of the display apparatus according to an embodiment to which the reflection adjustment layer RCL is applied, may be about 60.7% or more.

In addition, since the reflection adjustment layer RCL may absorb or attenuate light in a wavelength range that does not strongly overlap the luminance distribution of the second light L2 or the third light L3, the reflection adjustment layer RCL may shift the luminance distribution of the first light L1 closer to the luminance distribution of the second light L2 or the third light L3. Thus, by applying the reflection adjustment layer RCL, a wavelength difference (or a color difference) between the front light (e.g., the first light L1) and the side light (e.g., the second light L2 or the third light L3) may be reduced.

Of course, the above-described effects are examples, and embodiments are not limited by these effects.

Figure 10:
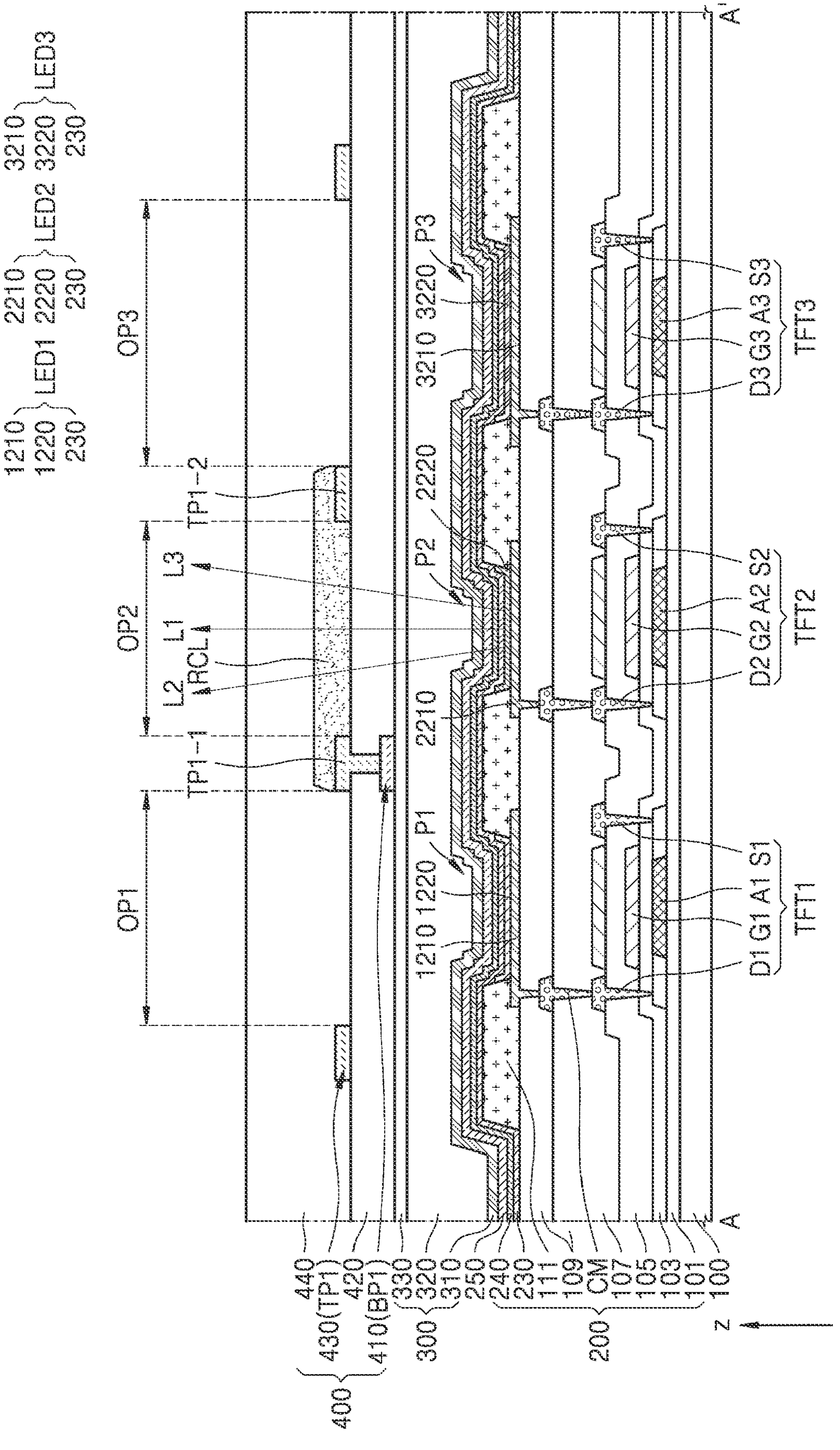

FIG. 10 is a cross-sectional view illustrating the display apparatus taken along a line A-A' of FIG. 6 according to another embodiment. The embodiment of FIG. 10 primarily differs from the embodiment of FIG. 9 in that the area of the reflection adjustment layer RCL in the embodiment of FIG. 10 may be limited to cover only some light emitting diodes. Other elements of the embodiment of FIG. 10 may be substantially the same as those described above.

Referring to FIG. 10, the reflection adjustment layer RCL may cover the first conductive line TP1-1 and/or the second conductive line TP1-2 and may be disposed between the touch insulating layer 420 and the planarization layer 440. For example, a portion of the reflection adjustment layer RCL may be disposed in the second opening OP2. Another portion of the reflection adjustment layer RCL may protrude in the +z direction from the upper surface of the second opening OP2, and yet another portion of the reflection adjustment layer RCL may be arranged on the first conductive line TP1-1 or the second conductive line TP1-2.

In an embodiment, one side surface of the reflection adjustment layer RCL may be on the same plane as the side surface of the first conductive line TP1-1 or the second conductive line TP1-2. For example, a portion of the reflection adjustment layer RCL may be disposed on the first conductive line TP1-1, and the side surface of the reflection adjustment layer RCL may be in the same plane as the side surface of the first conductive line TP1-1. Another portion of the reflection adjustment layer RCL may be disposed on the second conductive line TP1-2, and the side surface of the reflection adjustment layer RCL may be in the same plane as the side surface of the second conductive line TP1-2.

In another embodiment, the reflection adjustment layer RCL may extend beyond the edge of the first conductive line TP1-1 or the second conductive line TP1-2. In other words, the first conductive line TP1-1 or the second conductive line TP1-2 may be covered by the reflection adjustment layer RCL.

The reflection adjustment layer RCL may correspond to the second light-emitting diode LED2 and may not be disposed on the first and third light-emitting diodes LED1 and LED3. Thus, in the area on the first and second light-emitting devices LED1 and LED3, the touch insulating layer 420 and the planarization layer 440 may be in direct contact with each other. For example, the touch insulating layer 420 and the planarization layer 440 may be in direct contact with each other within the first opening OP1. The touch insulating layer 420 and the planarization layer 440 may be in direct contact with each other within the third opening OP3.

FIG. 10 illustrates an embodiment in which the reflection adjustment layer RCL covers both the upper surface of the first conductive line TP1-1 and the upper surface of the second conductive line TP1-2. However, embodiments are not limited thereto. In another embodiment, the reflection adjustment layer RCL may cover only the upper surface of one of the first conductive line TP1-1 and the second conductive line TP1-2.

The second opening OP2 may be entirely filled by the reflection adjustment layer RCL. In other words, the touch insulating layer 420 and the planarization layer 440 may not be in direct contact with each other in an area overlapping the second opening OP2.

Figure 11:
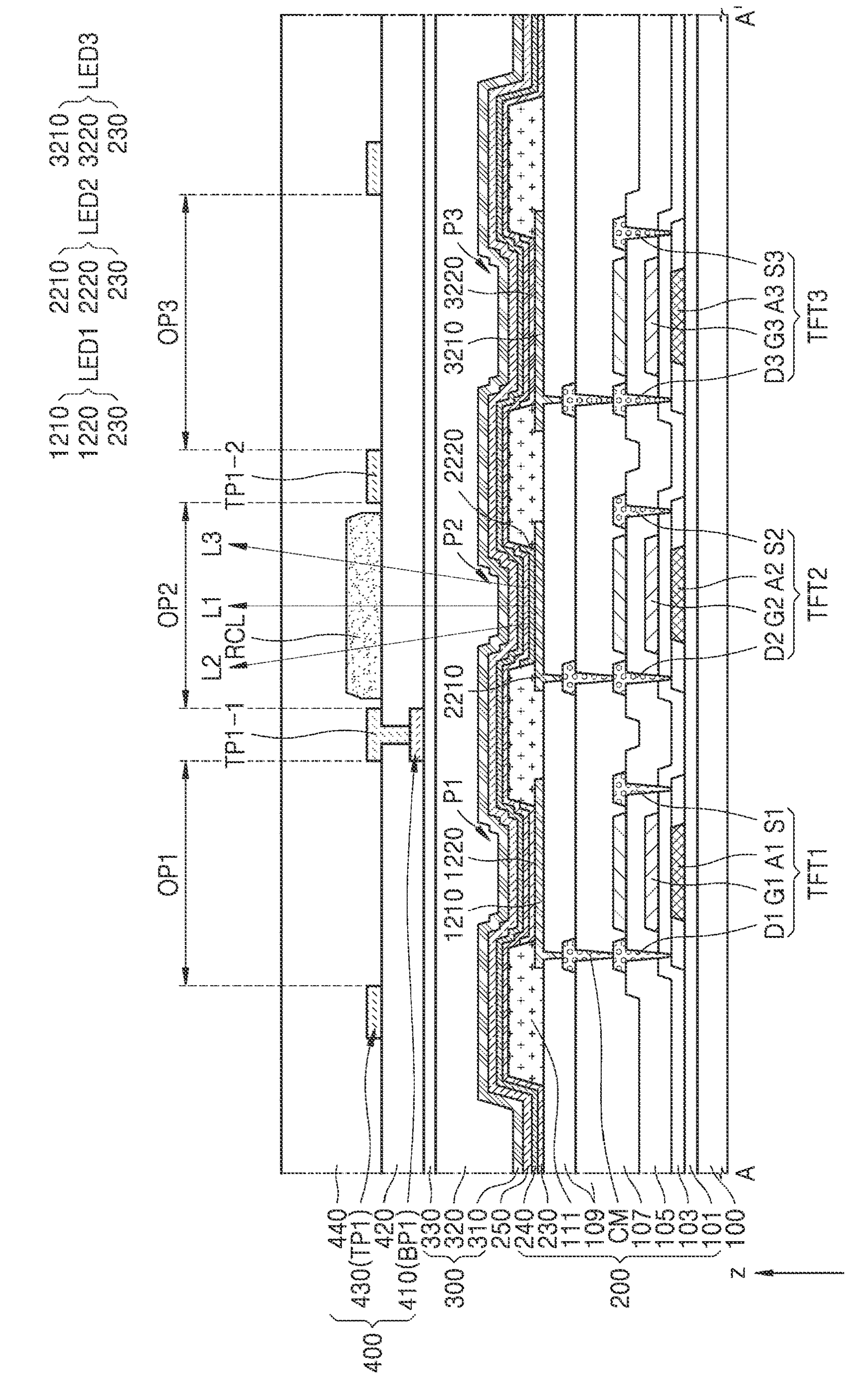

FIG. 11 is a cross-sectional view illustrating the display apparatus taken along a line A-A' of FIG. 6 according to another embodiment. The embodiment of FIG. 11 primarily differs from the embodiment of FIG. 10 in that the reflection adjustment layer RCL in the embodiment of FIG. 11 may have a smaller area than does the reflection adjustment layer RCL in the embodiment of FIG. 10. Other elements of the embodiment of FIG. 11 may be substantially the same as those described above.

Referring to FIG. 11, the reflection adjustment layer RCL may be disposed between the first conductive line TP1-1 and the second conductive line TP1-2 and may be between the touch insulating layer 420 and the planarization layer 440. A portion of the reflection adjustment layer RCL may be disposed in the second opening OP2.

A side surface of the reflection adjustment layer RCL may be spaced apart from the first conductive line TP1-1 and the second conductive line TP1-2. In other words, the width of the reflection adjustment layer RCL may be less than the width of the second opening OP2. Thus, the touch insulating layer 420 and the planarization layer 440 may be in direct contact with each other in a partial region of the second opening OP2.

FIG. 11 illustrates that the thickness of the reflection adjustment layer RCL is greater than the thickness of the second touch electrode layer 430, for example, the first and second conductive lines TP1-1 and TP1-2. However, embodiments are not limited thereto. In another embodiment, the thickness of the reflection adjustment layer RCL may be less than the thickness of the first and second conductive lines TP1-1 and TP1-2, and all portions of the reflection adjustment layer RCL may be disposed in the second opening OP2.

Figure 12:
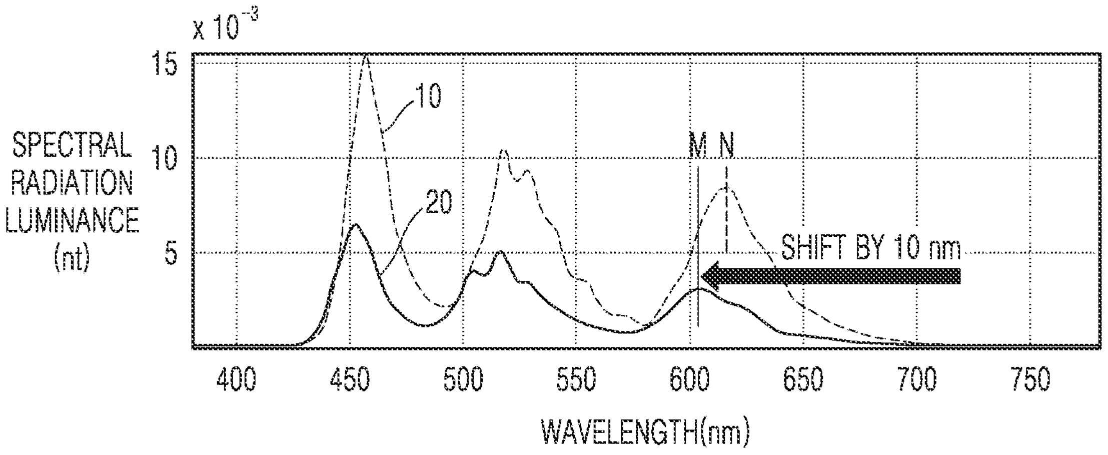
FIG. 12 is a graph showing the luminance distributions according to wavelength of front light and side light.

FIG. 12 shows plots of the luminance distributions according to wavelength of front light and side light from a pixel or light emitting device that emits red, green, and blue light.

A first distribution line 10 may indicate the distribution of front light. The first distribution line 10 may particularly show the luminance of light of specific wavelengths measured in a direction perpendicular to the upper surface of a light-emitting device (or a direction perpendicular to the upper surface of the substrate).

A second distribution line 20 may show the distribution of side light. The second distribution line 20 may particularly show the luminance of light of specific wavelengths measured at a certain angle (for example, 45 degrees) based on the upper surface of the light-emitting device. For example, the second distribution line 20 may show a luminance of light of specific wavelengths measured in a direction about 45 degrees oblique with respect to the upper surface of the substrate.

The x-axis of the graph may indicate wavelength, and the y-axis may indicate a spectral radiation luminance.

The wavelength of a peak luminance of the luminance distribution in the wavelength range of a certain color may be the center wavelength for that color. In a red wavelength range, the center wavelength (a virtual line N of FIG. 12) of the first distribution line 10 (or front light) may be shifted by about 10 nm from the center wavelength of the second distribution line 20 (or side light). As shown in FIG. 12, the center wavelength of the red light wavelength range of the first distribution line 10 may be about 615 nm, and the center wavelength of the red light wavelength range of the second distribution line 20 may be about 605 nm.

In a blue wavelength range, the center wavelength of the first distribution line 10 may be about 460 nm, and the center wavelength of the second distribution line 20 may be about 455 nm. In a green wavelength range, the center wavelength of the first distribution line 10 may be about 525 nm, and the center wavelength of the second distribution line 20 may be about 510 nm.

As described above, in the red, green, and blue wavelength ranges, the center wavelength of the side light may be relatively shorter than the center wavelength of the front light. Thus, the front and side light may be recognized as lights having different wavelengths, that is, different colors depending on the observer's position. In other words, colors of the same image provided by the same display apparatus may be recognized differently at different view angles.

The y-value of the first distribution line 10 may be greater than the y-value of the second distribution line 20 at all wavelengths. In other words, the luminance of the front light may be greater than the luminance of the side light at all wavelengths. For example, in the same x-value, the y-value of the first distribution line 10 may be greater than the y-value of the second distribution line 20. In other words, at the same wavelength, the luminance of the front light may be greater than the luminance of the side light. Thus, a luminance ratio that is a value obtained by dividing the luminance of the side light by the luminance of the front light may be less than 1 at all wavelengths.

Figure 13:
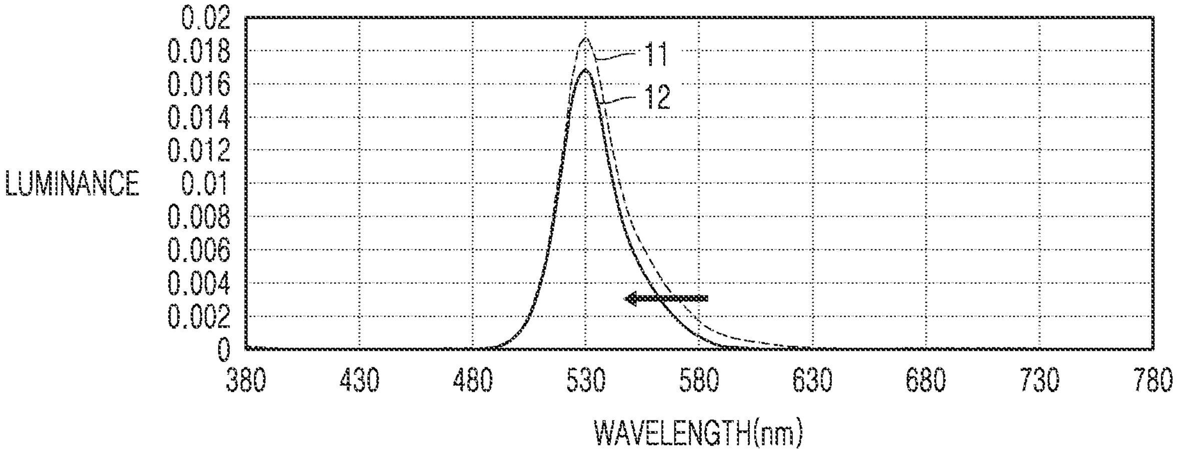
FIG. 13 is a graph showing the luminance distribution of front light according to wavelength before and after a color filter layer according to an embodiment is applied.

FIG. 13 shows the respective luminance distributions according to wavelength of front light before and after a color filter layer according to an embodiment is applied. The luminance distributions shown in FIG. 13 may be provided by extracting the green light wavelength range of the luminance distribution of the front light according to wavelength.

Referring to FIG. 13, the x-axis represents wavelength, the unit of wavelength is nanometers (nm), the y-axis represents a luminance and an arbitrary unit.

FIG. 13 shows a first luminance 11 that results when a color filter layer according to an embodiment is not applied and shows a second luminance plot 12 that results when a color filter layer according to an embodiment is applied. The first luminance 11 is a comparative example of the disclosure and shows a state in which the color filter layer described with reference to FIG. 7 is not applied.

The first luminance 11 may be entirely greater than the second luminance 12. That is, the luminance (or the first luminance 11) of the front light before the color filter layer is applied may be entirely greater than the luminance (or the second luminance 12) of the front light after the color filter layer is applied. In other words, by applying a color filter layer according to an embodiment, the luminance of the front light may be entirely reduced, but the luminance ratio, which is obtained by dividing the luminance of the side light by the luminance of the front light, may be entirely increased.

By applying the color filter layer according to an embodiment, light in a certain wavelength range (for example, light in a short wavelength range) may be selectively transmitted through the color filter layer. Thus, by applying a color filter layer according to an embodiment, the effect of shifting the wavelength range of the front light entirely toward the short wavelength range may be achieved. Thus, in the long wavelength range (e.g., about 570 nm to about 580 nm), the color filter may have a larger effect on the first luminance 11, which leaves the second luminance 12 more on the left or in a relatively shorter wavelength range than the first luminance 11. This may reduce a wavelength difference between the front light and the side light. Thus, a color difference between the front light and the side light may be reduced so that visibility of the display apparatus may be enhanced over a wide range of the observer's position.

Figure 14:
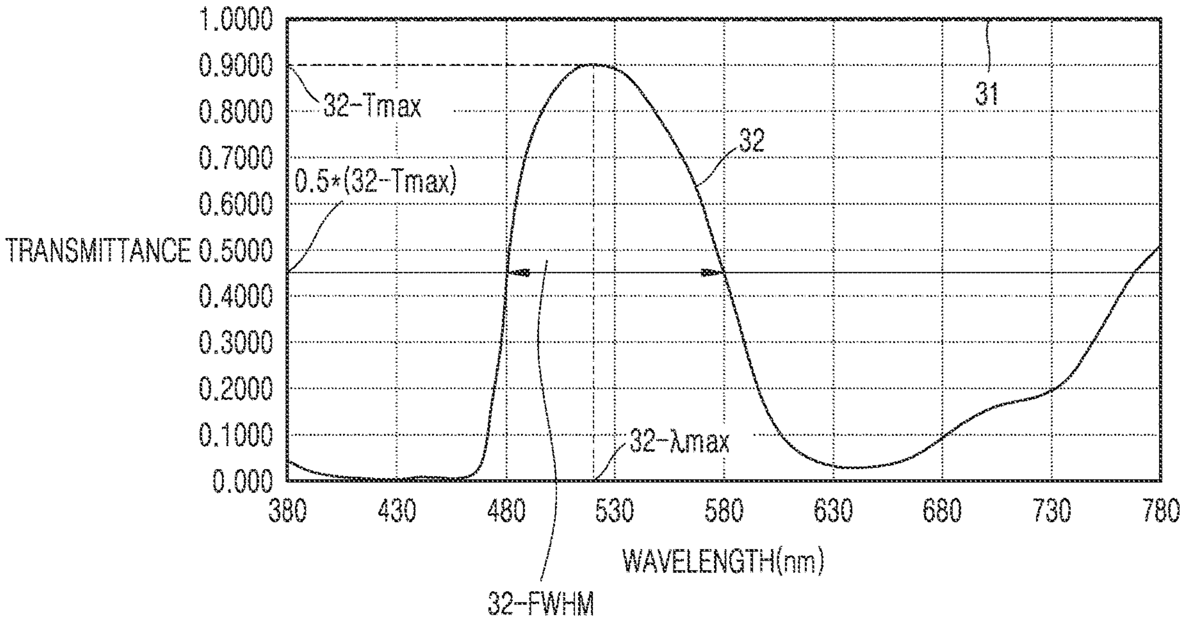
FIG. 14 is a graph showing the transmittance distribution of front light according to wavelength when a color filter layer according to an embodiment is used.

FIG. 14 is a graph showing the transmittance distribution of front light according to wavelength when a color filter layer according to an embodiment is applied. The graph shown in FIG. 14 may be provided by extracting the green light wavelength range of the luminance distribution of the front light.

Referring to FIG. 14, the x-axis represents wavelength, the unit of wavelength is nm, and the y-axis represents a transmittance.

The first transmittance 31 in FIG. 14 is transmittance when a color filter layer is not applied as a comparative example of the disclosure, and the first transmittance is a transmittance of 1.0000, representing 100% when no color filter layer is applied. The transmittance of the color filter layer according to an embodiment may be a second transmittance 32 and may have the distribution shown in FIG. 14.

The wavelength in the peak of the transmittance distribution line may be defined as the center wavelength, and the transmittance in the center wavelength may be defined as the maximum transmittance. For example, the wavelength in the peak of the second transmittance may be defined as the center axis 32-λmax of the second transmittance 32, and a transmittance at the center axis 32-λmax of the second transmittance 32 may be defined as maximum transmittance 32-Tmax of the second transmittance 32.

In some embodiments, the center wavelength 32-λmax of the second transmittance 32 may be located in the wavelength range of about 520 nm to about 530 nm. For example, the center axis 32-λmax of the second transmittance 32 may be about 525 nm.

In some embodiments, a maximum transmittance 32-Tmax of the second transmittance 32 may be about 90% or more. For example, the maximum transmittance 32-Tmax of the second transmittance 32 may be about 90.5% or more.

The difference (or distance) between the two wavelengths at half of the maximum transmittance of the transmittance distribution line may be defined as a Full Width at Half Maximum (FWHM). For example, the difference between two points at which a line indicating half (e.g., about 45% that is half of about 90%) of the maximum transmittance 32-Tmax of the second transmittance 32 meet the second transmittance 32 may be seen as a FWHM 32-FWHM of the second transmittance 32.

In some embodiments, the FWHM 32-FWHM of the second transmittance 32 may be about 100 nm or less. For example, the FWHM 32-FWHM of the second transmittance 32 may be about 99.6 nm.

Figure 15:
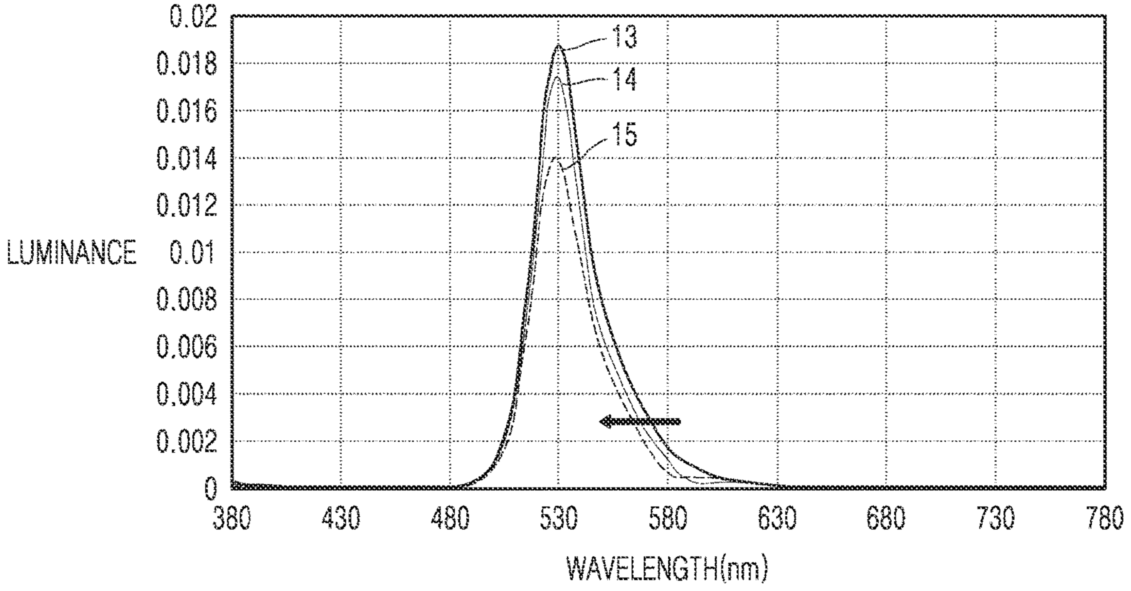
FIG. 15 is a graph showing the luminance distributions of front light according to wavelength before and after a reflection adjustment layer according to various embodiments is applied.

FIG. 15 shows the respective luminance distributions according to wavelength of front light before and after a reflection adjustment layer according to various embodiments is applied. The graph shown in FIG. 15 may be provided by extracting the green light wavelength range of the luminance distribution according to wavelength of the front light.

Referring to FIG. 15, the x-axis represents wavelength, the unit of wavelength is nm, and the y-axis represents a transmittance as a relative value.

The third luminance 13 of FIG. 15 illustrates a comparative example where a reflection adjustment layer according to an embodiment is not applied. The fourth luminance 14 illustrates a case where a first reflection adjustment layer is applied, as shown in FIG. 9, according to an embodiment. The fifth luminance 15 illustrates a case where a second reflection adjustment layer is applied, as shown in FIG. 9, according to another embodiment. The first and second reflection adjustment layers may include different materials. For example, the first and second reflection adjustment layers may include materials that absorb light in certain wavelength ranges, and the wavelength ranges (or central wavelength) of light absorbed by the materials may be different. (See also FIG. 16.)

The third luminance 13 may be entirely greater than the fourth luminance 14 and the fifth luminance 15. That is, the luminance (or the third luminance 13) of the front light before a reflection adjustment layer is applied may be entirely greater than the luminance (or the fourth luminance 14 and the fifth luminance 15) of the front light after the reflection adjustment layer is applied. In other words, by applying a reflection adjustment layer according to an embodiment, the luminance of the front light may be entirely reduced, but the luminance ratio, which is obtained by dividing the luminance of the side light by the luminance of the front light, may be entirely increased.

The fourth luminance 14 may be entirely greater than the fifth luminance 15. That is, when a second reflection adjustment layer is applied, reduction in the luminance of the front light may be greater than the case where the first reflection adjustment layer is applied. However, when the second reflection adjustment layer is applied, the luminance ratio may be further increased compared to the case where the first reflection adjustment layer is applied.

By applying the reflection adjustment layer according to an embodiment, light in a certain wavelength range (for example, light in a long wavelength range) may be selectively transmitted through or reflected in the reflection adjustment layer. Thus, by applying a reflection adjustment layer according to an embodiment, the effect of shifting the wavelength range of the front light entirely to the short wavelength range may be achieved. Thus, the fourth luminance 14 and the fifth luminance 15 may be on the left or in a relatively shorter wavelength range compared to the third luminance 13. This may reduce a wavelength difference between the front light and the side light.

The fifth luminance 15 may be located in the area toward the left side or relatively short wavelength compared to the fourth luminance 14. Accordingly, when the second reflection adjustment layer is applied, the luminance distribution of the front light may be shifted toward shorter wavelengths compared to when the first reflection adjustment layer is applied. Thus, the effect of reducing a wavelength difference between the front light and the side light in the fifth luminance 15 to which the second reflection adjustment layer is applied, may be greater than in the fourth luminance 14 to which the first reflection adjustment layer is applied.

When the wavelength difference between the front light and the side light is reduced, a color difference between the front light and the side light may be reduced so that visibility of the display apparatus from a range of observer positions may be improved.

In the fifth luminance 15, the effect of reducing the luminance ratio and the wavelength difference between the front light and the side light may be greater than in the fourth luminance 14. As shown, the luminance of the front light of the fifth luminance 15 may be entirely less than the luminance of the front light of the fourth luminance 14.

Figure 16:
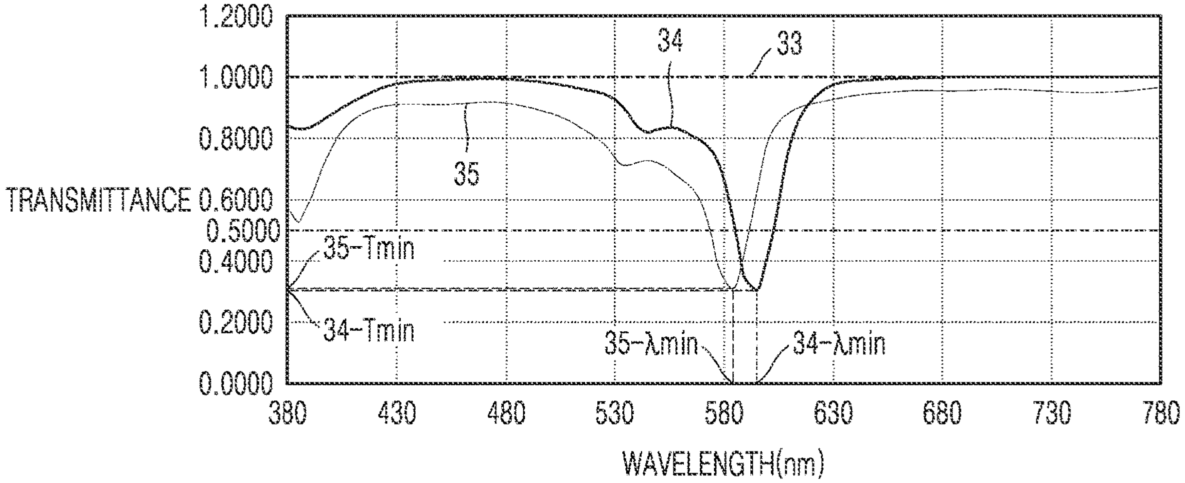
FIG. 16 is a graph showing the transmittance distribution of front light according to wavelength when a reflection adjustment layer according to various embodiments are used.

FIG. 16 is a graph showing transmittance distributions according to wavelength of front light when a reflection adjustment layer according to various embodiments is applied. Referring to FIG. 16, the x-axis represents wavelength, the unit of wavelength is nm, and the y-axis represents a transmittance.

The third transmittance 33 in FIG. 16 is a transmittance for a comparative example in which no reflection adjustment layer is applied, resulting in a transmittance of 1.0000 or 100% as a percentage. The fourth transmittance 34 represents a transmittance of a first reflection adjustment layer according to an embodiment. The fifth transmittance 35 represents a transmittance of a second reflection adjustment layer according to another embodiment.

The reflection adjustment layer may include a material that absorbs, reflects, or otherwise blocks light in a certain wavelength range. The wavelength at the bottom of a valley of the transmittance distribution line may be defined as the center wavelength, and the transmittance in the center wavelength may be defined as the minimum transmittance. For example, the wavelength in the valley of the fourth transmittance 34 may be defined as the center axis 34-λmin of the fourth transmittance 34, and a transmittance at the center axis 34-λmin of the fourth transmittance 34 may be defined as a minimum transmittance 34-Tmin of the fourth transmittance 34. The wavelength at the bottom of a valley of the fifth transmittance 35 may be defined as the center axis 35-λmin of the fifth transmittance 35, and transmittance at the center axis 35-λmin of the fifth transmittance 35 may be defined as a minimum transmittance 35-Tmin of the fifth transmittance 35.

A material included in the first reflection adjustment layer having the fourth transmittance 34 and a material included in the second reflection adjustment layer having the fifth transmittance 35 may have different center wavelengths and minimum transmittance.

In an embodiment, the center axis 34-λmin of the fourth transmittance 34 may be about 595 nm. In an embodiment, the center axis 35-λmin of the fifth transmittance 35 may be about 585 nm.

In some embodiments, the minimum transmittance 34-Tmin of the fourth transmittance 34 and the minimum transmittance 35-Tmin of the fifth transmittance 35 may be about 50% or less. In an embodiment, in the wavelength range of about 585 nm to about 595 nm, both the fourth transmittance 34 and the fifth transmittance 35 may be about 50% or less.

Referring to FIGS. 15 and 16, a luminance and a transmittance when the first reflection adjustment layer is applied, may be the fourth luminance 14 and the fourth transmittance 34. The luminance and the transmittance when the second reflection adjustment layer is applied, may be the fifth luminance 15 and the fifth transmittance 35.

The fifth transmittance 35 may be entirely less than the fourth transmittance 34. The fifth luminance 15 may be entirely less than the fourth luminance 14. Thus, a luminance ratio (a luminance ratio of the display apparatus when a second reflection adjustment layer is applied) corresponding to the fifth luminance 15 may be greater than luminance ratio (a luminance ratio of the display apparatus when a first reflection adjustment layer is applied) corresponding to the fourth luminance 14. In an embodiment, the luminance ratio corresponding to the fifth luminance 15 may be about 60.7%, and the luminance ratio corresponding to the fourth luminance 14 may be about 58.5%.

According to an embodiment, a display apparatus in which the luminance ratio of the side light with respect to the front light is increased, i.e., the luminance difference between the front light and the side light is reduced, may be provided. In addition, a display apparatus reduces a wavelength difference between the front light and the side light may be reduced so that a color difference between the front light and the side light is reduced and the observer's position has less effect on the color of the image seen. The above-described effects are illustrative, and the effects of the disclosure are not limited to the above description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a first light-emitting device, a second light-emitting device, and a third light-emitting device, the first light-emitting device, the second light-emitting device, and the third light-emitting device being arranged on a substrate;

an encapsulation layer covering the first through third light-emitting devices;

a touch electrode disposed on the encapsulation layer and having a first opening, a second opening, and a third opening respectively overlapping the first through third light-emitting devices on a plane;

a touch insulating layer disposed on the encapsulation layer;

a color filter layer disposed on the touch insulating layer and also disposed in the second opening of the touch electrode overlapping the second light-emitting device; and a planarization layer disposed on the color filter layer, wherein the planarization layer is in direct contact with an upper surface of the touch insulating layer through the first opening and the third opening of the touch electrode.

2. The display apparatus of claim 1, wherein a width of the color filter layer is less than a width of the second opening.

3. The display apparatus of claim 1, wherein the touch electrode comprises a first conductive line and a second conductive line, the second opening being between the first conductive line and the second conductive line.

4. The display apparatus of claim 3, wherein the color filter layer is disposed between the first conductive line and the second conductive line of the touch electrode.

5. The display apparatus of claim 3, wherein the color filter layer covers an upper surface of the first conductive line and an upper surface of the second conductive line of the touch electrode.

6. The display apparatus of claim 5, wherein one side surface of the color filter layer and one side surface of the first conductive line of the touch electrode are on a plane.

7. The display apparatus of claim 1, wherein the color filter layer comprises a material having a maximum transmittance in a wavelength range of about 520 nm to about 530 nm.

8. The display apparatus of claim 7, wherein the maximum transmittance of the material of the color filter layer is 90% or more.

9. The display apparatus of claim 8, wherein the material of the color filter layer has a Full Width at Half Maximum (FWHM) of 100 nm or less.

10. The display apparatus of claim 1, wherein a luminance of the display apparatus measured in a direction oblique to an upper surface of the substrate at 45 degrees is 60% or more of a luminance of the display apparatus measured in a direction perpendicular to the upper surface of the substrate at 90 degrees.

11. The display apparatus of claim 1, wherein the planarization layer comprises a plurality of layers including different materials.

12. A display apparatus comprising:

a first light-emitting device, a second light-emitting device, and a third light-emitting device, the first light-emitting device, the second light-emitting device, and the third light-emitting device being arranged on a substrate;

an encapsulation layer covering the first through third light-emitting devices and including an inorganic material;

a touch electrode disposed on the encapsulation layer and having a first opening, a second opening, and a third opening respectively overlapping the first through third light-emitting devices on a plane;

a touch insulating layer disposed on the encapsulation layer;

a reflection adjustment layer disposed on and directly contacting the touch electrode and including a material that absorbs light in a wavelength range of about 580 nm to about 600 nm; and a planarization layer covering the reflection adjustment layer.

13. The display apparatus of claim 12, wherein the reflection adjustment layer is disposed in the second opening of the touch electrode.

14. The display apparatus of claim 12, wherein the reflection adjustment layer extends to overlap the first opening, the second opening, and the third opening of the touch electrode.

15. The display apparatus of claim 12, wherein the reflection adjustment layer comprises a material having a transmittance of 0.5 or less in a wavelength range of about 585 nm to about 595 nm.

16. The display apparatus of claim 12, wherein a luminance of the display apparatus measured in a direction oblique to an upper surface of the substrate at 45 degrees is 60% or more of a luminance of the display apparatus measured in a direction perpendicular to the upper surface of the substrate at 90 degrees.

17. The display apparatus of claim 12, wherein the planarization layer comprises a plurality of layers including different materials.

18. A display apparatus comprising:

a first light-emitting device, a second light-emitting device, and a third light-emitting device, the first light-emitting device, the second light-emitting device, and the third light-emitting device being arranged on a substrate;

an encapsulation layer covering the first through third light-emitting devices and including an inorganic material;

a touch electrode disposed on the encapsulation layer and having a first opening, a second opening, and a third opening respectively overlapping the first through third light-emitting devices on a plane;

a touch insulating layer disposed on the encapsulation layer;

a reflection adjustment layer disposed on the touch electrode and including a material that absorbs light in a wavelength range of about 580 nm to about 600 nm, wherein the reflection adjustment layer is disposed in the second opening of the touch electrode; and a planarization layer covering the reflection adjustment layer, wherein the planarization layer is in direct contact with the touch insulating layer through the first opening and the third opening of the touch electrode.

19. The display apparatus of claim 18, wherein the touch electrode comprises conductive lines surrounding the second opening, and the reflection adjustment layer overlaps an upper surface of the conductive lines of the touch electrode.

20. The display apparatus of claim 18, wherein a width of the reflection adjustment layer is less than a width of the second opening of the touch electrode.

* * * * *